(12) United States Patent
Ye

(10) Patent No.: US 8,194,788 B2
(45) Date of Patent: Jun. 5, 2012

(54) RECEIVER AND METHOD FOR RECEIVING WIRELESS SIGNALS

(75) Inventor: Siqing Ye, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 751 days.

(21) Appl. No.: 12/277,069

(22) Filed: Nov. 24, 2008

(65) Prior Publication Data

US 2009/0141830 A1 Jun. 4, 2009

Related U.S. Application Data

(63) Continuation of application No. PCT/CN2006/003473, filed on Dec. 18, 2006.

(30) Foreign Application Priority Data

May 30, 2006 (CN) .......................... 2006 1 0083529

(51) Int. Cl.
*H03K 9/00* (2006.01)
*H04L 27/00* (2006.01)

(52) U.S. Cl. .......................... 375/316; 375/345; 375/349

(58) Field of Classification Search .................. 375/285, 375/316, 345–346, 349
See application file for complete search history.

(56) References Cited

U.S. PATENT DOCUMENTS

| | | | | |
|---|---|---|---|---|
| 4,882,589 A | * | 11/1989 | Reisenfeld | 342/374 |
| 5,159,710 A | * | 10/1992 | Cusdin | 455/304 |
| 5,872,481 A | | 2/1999 | Sevic et al. | |
| 5,940,029 A | * | 8/1999 | Ninomiya et al. | 342/372 |
| 7,023,273 B2 | | 4/2006 | Johnson et al. | |
| 7,058,425 B1 | * | 6/2006 | Takakusaki | 455/561 |
| 7,474,881 B2 | * | 1/2009 | Ito et al. | 455/132 |
| 2002/0098812 A1 | | 7/2002 | Sourour et al. | |
| 2004/0229581 A1 | * | 11/2004 | Mizoguchi et al. | 455/136 |

(Continued)

FOREIGN PATENT DOCUMENTS

CN 1332524 A 1/2002

(Continued)

OTHER PUBLICATIONS

Written Opinion of the International Searching Authority in corresponding PCT Application No. PCT/CN2006/003473 (Mar. 29, 2007).

(Continued)

Primary Examiner — Jen B Corrielus
(74) Attorney, Agent, or Firm — Leydig, Voit & Mayer, Ltd.

(57) ABSTRACT

A receiver and method for receiving wireless signal are characterized in that a multi-branch correcting and switching module (402) is added, which is used for amplitude and phase correction of multiple digital baseband signals outputted from a multi-branch correction preprocess module (401); then, the signals are switched according to a switching strategy, and one of the corrected digital baseband signals is outputted; finally, the selected digital baseband signal is inputted to a digital receiving path post-stage (403) and further digital processing on the signal is performed, so that a bit stream is outputted. The multiple digital baseband signals are corrected before switching to be consistent with each other in terms of amplitude and phase, and specific synchronization information is not necessary; therefore, the signals can be switched rapidly when the signals are varied and need to be switched, and a rapid track for the signal change is achieved.

20 Claims, 18 Drawing Sheets

U.S. PATENT DOCUMENTS

| | | | |
|---|---|---|---|
| 2005/0147190 A1* | 7/2005 | Nishikawa | 375/343 |
| 2005/0260968 A1* | 11/2005 | Ito et al. | 455/337 |
| 2007/0015545 A1* | 1/2007 | Leifer et al. | 455/562.1 |
| 2009/0291649 A1* | 11/2009 | Fortier et al. | 455/114.3 |

FOREIGN PATENT DOCUMENTS

| | | | |
|---|---|---|---|
| CN | 1369995 A | 9/2002 |
| CN | 1476707 A | 2/2004 |
| CN | 1496014 A | 5/2004 |
| CN | 1607722 A | 4/2005 |
| CN | 1697440 A | 11/2005 |
| CN | 100492921 C | 5/2009 |
| EP | 1505725 A1 | 2/2005 |

OTHER PUBLICATIONS

International Search Report in corresponding PCT Application No. PCT/CN2006/003473 (Mar. 29, 2007).

European Patent Office, Extended European Search Report in European Application No. 06828384.5 (Mar. 22, 2012).

* cited by examiner

RECEIVER AND METHOD FOR RECEIVING WIRELESS SIGNALS

CROSS-REFERENCE TO RELATED APPLICATIONS

This application is a continuation of International Patent Application No. PCT/CN2006/003473, filed Dec. 18, 2006, which claims priority to Chinese Patent Application No. 200610083529.X, filed May 30, 2006, both of which are hereby incorporated by reference in their entirety.

FIELD OF THE INVENTION

The present invention relates to wireless receiving technologies, and particularly, to a receiver and a wireless signal receiving method.

BACKGROUND OF THE INVENTION

In a wireless communication or radar system, a device for receiving wireless signals is generally referred to as a wireless receiver or receiver. There exist numerous types of receivers, and a major index of the receiver used for evaluating the performance of the receivers is the dynamic range.

The dynamic range of a receiver includes a simultaneous dynamic range and a non-simultaneous dynamic range. The simultaneous dynamic range refers to a capability of the receiver of demodulating a large signal and a small signal simultaneously and accurately in the case where the large signal and the small signal coexist, and a value of the simultaneous dynamic range is generally the maximum value of a ratio of the power of the large signal to that of the small signal. The non-simultaneous dynamic range refers to a capability of the receiver of demodulating a fluctuant signal which varies with the time, and a value of the non-simultaneous dynamic range is generally a ratio of the maximum power of the fluctuant signal to the minimum power of the fluctuant signal. If a large signal and a small signal inputted simultaneously to the receiver can be demodulated accurately by the receiver, the large signal and the small signal can certainly be demodulated accurately by the receiver when the large signal and the small signal are inputted non-simultaneously because no interference exists between the large signal and the small signal. Therefore, the non-simultaneous dynamic range of a receiver is typically larger than the simultaneous dynamic range of the receiver. In practice, the non-simultaneous dynamic range of the receiver can be extended using the Analog Automatic Gain Control (AAGC) technology.

At present, the AAGC technology includes a single variable-gain branch technology and a multi-fixed-gain-branch technology. In the single variable-gain branch technology, a single branch with variable gain is used to process the received signal. In the multi-fixed-gain-branch technology, multiple fixed-gain branches, each of which has a different fixed gain, are used to process the received signal.

FIG. 1 is a diagram showing the basic structure of a receiver receiving wireless signals using the single variable-gain branch technology. As shown in FIG. 1, the receiver with single variable-gain branch includes an upstream analog receiving path module, a variable-gain analog receiving path, an Analog-to-Digital Converter (ADC), a power detecting and AAGC control module, and a digital receiving path module.

The upstream analog receiving path module, which includes a low noise amplifier and may further include a frequency mixer, a filter, etc., preprocesses the received input signal. The input signal of the upstream analog receiving path module, i.e. the input signal of the receiver, is an analog band-pass signal. If the upstream analog receiving path module does not include analog I&Q demodulating components, the output of the upstream analog receiving path module is generally an analog band-pass signal; and if the upstream analog receiving path module includes analog I&Q demodulating components, the output of the upstream analog receiving path module are analog I&Q signals.

The variable-gain analog receiving path module includes multiple stages of frequency mixing, filtering, an amplification, etc., and the gain of the variable-gain analog receiving path module can be changed under the control of the power detecting and AAGC control module.

The ADC converts an analog signal to a digital signal. The ADC is a single-path ADC in the case where a single analog band-pass signal is inputted, and is a dual-path ADC, i.e. I&Q ADCs, in the case where analog I&Q signals are inputted.

The power detecting and AAGC control module processes the signal outputted from the ADC module to obtain a signal power value, determines gain configuration according to the signal power value, and changes the gain of the variable-gain analog receiving path under the control of a demodulation synchronization signal.

The digital receiving path module filters and decimates the signal outputted from the ADC to obtain a baseband signal, and demodulates the baseband signal to obtain a bit stream. A single bit stream is outputted by the digital receiving path module if the receiver is single-carrier receiver, and multiple bit streams are outputted if the receiver is a multi-carrier receiver.

As shown in FIG. 1, the variable-gain analog receiving path, the ADC and the power detecting and AAGC control module form a feedback loop. After the input signal passes through the upstream analog receiving path module, the variable-gain analog receiving path and the ADC, the power detecting and AAGC control module detects the power of the input signal, and sets the gain of the variable-gain analog receiving path to an appropriate value, according to the dynamic range of the receiver and a certain AAGC algorithm.

The single variable-gain branch technology is disadvantageous in the following aspects.

(1) Because power of the input signal is controlled using a feedback loop, it takes some time to update a gain of the receiver in response to a change of the input signal, so that the control speed is restricted by the response time.

(2) The power detecting and AAGC control module updates the gain under the control of a demodulation synchronization signal, not at an arbitrary point of time. In other words, the power detecting and AAGC control module can update the gain at synchronous boundaries only; otherwise, the change on the analog device gain and an induced phase change may impact the demodulation performance. Therefore, the gain of the receiver needs to be maintained constant within duration of the signal. In other words, a synchronous AAGC is required, as a result, circuitry complexity is increased and the channel change cannot be traced rapidly.

(3) If a large change on the input signal occurs within the duration of the signal and exceeds the non-simultaneous dynamic range of the single path, the signal passing through the variable-gain analog receiving path is inevitably saturated or lower than the sensitivity, regardless of the control by the AAGC. This results in an increased error bit rate.

In the prior art, the multi-fixed-gain-branch technology, as another AAGC technology, is characterized in that no feedback loop is required to control the gain; instead, multiple branches each having a different fixed gain are deployed to amplify the input signal, and a proper branch is selected to output. In other words, a switching between the branches is performed. A receiver built according to the multi-fixed-gain-branch technology generally includes a multi-fixed-gain-branch receiver which switches before demodulation and a multi-fixed-gain-branch receiver which switches after demodulation.

FIG. 2 is a diagram showing the basic structure of a multi-fixed-gain-branch receiver which switches before demodulation. As shown in FIG. 2, the receiver includes an upstream analog receiving path module, M fixed-gain branch modules, M ADCs, M digital receiving path fore-stages, a multi-branch synchronous switching module, and a digital receiving path post-stage.

The upstream analog receiving path module is the same as that of the single variable-gain branch receiver, and description thereof is omitted.

Compared with the single variable-gain branch receiver, the fixed-gain branch module also includes multiple stages of a frequency mixer module, a filter module, and an amplifier module, but has a fixed gain. Furthermore, gains of the M fixed-gain branch modules form a ladder distribution, which is referred to as ladder gain processing. For example, the gain of the first branch is 80 db, the gain of the second gain branch is 60 db, and the gain of the third branch is 40 db, and so on. In practice, the gain difference between two adjacent branches may be different.

Each of the ADCs is the same as that of the single variable-gain branch receiver, and description thereof is omitted.

The digital receiving path module performs processing, such as filtering and decimation, on the signal from the ADC for multiple times to obtain a baseband signal, and demodulates the baseband signal to obtain a bit steam. As shown in FIG. 2, in the multi-fixed-gain-branch receiver which switches before demodulation, the digital receiving path module is divided by the multi-branch synchronous switching module into two parts, i.e. the M digital receiving path fore-stages and the digital receiving path post-stage. The M digital receiving path fore-stages perform partial processing on the signals from the ADCs, the multi-branch synchronous switching module switches synchronously under the control of a demodulation synchronization signal to select and output a branch signal having appropriate power, and the outputted signal is further subjected to digital processing, such as demodulation by the digital receiving path post-stage to output a resulting bit stream. It is noted that the position where the multi-branch synchronous switching module is interposed into the digital receiving path module is dependent upon actual design of the receiver, and is not limited strictly, as long as it is deployed before the demodulation processing.

The input signal received by the multi-fixed-gain-branch receiver which switches before demodulation is subjected to processing, such as frequency mixing, filtering, and amplification by the upstream analog receiving path module, inputted to the M fixed-gain branches, which changes the power of the signal, respectively, and then subjected to processing, such as filtering and decimation by the M ADCs, respectively, to obtain digital signals. The obtained digital signals pass through the M digital receiving path fore-stages, the multi-branch synchronous switching module selects a branch having a signal with appropriate power, and the signal is demodulated by the digital receiving path post-stage to output the bit stream.

In addition, similar to the single variable-gain branch receiver, the input signal of the multi-fixed-gain-branch receiver which switches before demodulation is an analog band-pass signal. If the upstream analog receiving path module and the fixed-gain branch module include analog I&Q demodulating components, the fixed-gain branch module outputs analog baseband signals, i.e. two analog low-pass signals of I and Q; otherwise, the fixed-gain branch module outputs an analog band-pass signal. Correspondingly, the ADC may include a single-path ADC or I&Q ADCs.

Further, a single bit stream is outputted from each of the digital receiving paths if the multi-fixed-gain-branch receiver which switches before demodulation is a single-carrier receiver, and multiple bit streams are outputted, if the multi-fixed-gain-branch receiver which switches before demodulation is a multi-carrier receiver.

The multi-fixed-gain-branch receiver which switches before demodulation is disadvantageous in the following aspects.

(1) The switching performed before demodulation needs to be synchronous. In other words, the switching is performed only at synchronous boundaries of the received signal, and therefore not only the circuitry complexity is increased, but also the channel change cannot be traced in real time by the switching.

(2) The input signal is inputted into multiple branches simultaneously, due to different circuitry characteristics of various branches, phases or amplitudes of the various branch signals at the same point of time before the switching may be different from each other. Further, switching time granularity is restricted to be lager than the duration of the signal because the receiver demodulates simultaneously the signal within the entire duration of the signal. If a large change on the input signal occurs within the duration of the input signal and exceeds the non-simultaneous dynamic range of the single path, the signal outputted cannot be normal within the entire duration of the signal and is inevitably saturated or lower than the sensitivity, regardless of the switching by the multi-branch synchronous switching module, as a result, demodulation performance within the duration of the signal is affected.

FIG. 3 is a diagram showing the basic structure of a multi-fixed-gain-branch receiver which switches after demodulation. As shown in FIG. 3, the multi-fixed-gain-branch receiver which switches after demodulation is similar to multi-fixed-gain-branch receiver which switches before demodulation. The digital receiving path module in the multi-fixed-gain-branch receiver which switches after demodulation is not divided into two parts by a multi-branch synchronous switching module, and after signals are demodulated completely, the multi-branch synchronous switching module selects and outputs a branch signal having the best demodulation performance. Because a synchronous signal can be obtained directly from the demodulated signals, no specific demodulation synchronization signal is required to control the switching for the switching branch after demodulation.

Additionally, it should be noted that, it is possible that no upstream analog receiving path module is included in the receiver in practice. In other words, the input signal of the receiver is inputted into the fixed-gain branch module. Further, analog I&Q demodulating components may be included in various fixed-gain branch modules, instead of the upstream analog receiving path module. Alternatively, neither the upstream analog receiving path module nor the various fixed-gain branch modules include the analog I&Q demodulating components, and digital I&Q signals are obtained from a single sampled digital band-pass signal by a digital component using a digital approach.

The technology of the multi-fixed-gain-branch receiver which switches after demodulation is disadvantageous in the following aspects.

(1) The demodulation is performed before the switching, and therefore M digital receiving path modules each including a demodulating component is required for the receiver, leading to a resource waste.

(2) Similar to the technology of the multi-fixed-gain-branch receiver which switches before demodulation, in the technology of the multi-fixed-gain-branch receiver which switches after demodulation, demodulation performance is also lowered in the case where a large change of the signal occurs within duration of the signal.

Accordingly, such a receiver and a wireless signal receiving method, in which switching between branches may be performed without control of a specific synchronous signal, a signal change may be traced rapidly, and demodulation performance may be ensured in the case where a large change of a signal occurs within duration of the signal, are not provided in the prior art.

SUMMARY OF THE INVENTION

The present invention provides a receiver and a wireless signal receiving method, in which switching between branches may be performed without control of a specific synchronous signal, a signal change may be traced rapidly, and demodulation performance may be ensured in the case where a large change of a signal occurs within duration of the signal.

For the first object of the invention, the present invention provides the following technical solution.

A receiver at least includes a multi-branch correction preprocess module and a digital receiving path post-stage. The receiver further includes:

a multi-branch correcting and switching module, adapted to apply amplitude and phase correction of M digital baseband signals outputted from the multi-branch correction preprocess module, select a digital baseband signal according to a switching strategy, and output the selected digital baseband signal to the digital receiving path post-stage.

For the second object of the invention, the present invention provides the following technical solution.

A wireless signal receiving method includes:

A. performing multi-branch correction preprocess on an input signal of a receiver, to obtain M digital baseband signals before amplitude and phase correction;

B. performing amplitude and phase correction on the M digital baseband signals before the amplitude and phase correction, and selecting a digital baseband signal subjected to the amplitude and phase correction, according a switching strategy; and C. performing further digital processing on the selected digital baseband signal to obtain a bit stream.

The receiver and the wireless signal receiving method provided in the present invention has the following advantages.

(1) In the invention, the multiple digital baseband signals are corrected before the switching and have consistent amplitudes and phases. Therefore, the switching may be performed at an arbitrary point of time. In other words, the switching may be performed on a sample by sample basis, without the control of a synchronous signal, so that complexity of synchronous circuit design is reduced. Furthermore, the switching may be performed immediately when a large change of the input signal occurs within the duration of the input signal, to trace the signal change rapidly.

(2) In the invention, the multiple digital baseband signals are corrected before the switching, therefore switching between any two branches has no impact on amplitude and phase continuity of a signal outputted as a result of switching, so that a non-simultaneous dynamic range is increased and demodulation performance is improved.

(3) The switching is performed before the demodulation in the invention, therefore only one demodulator is required in the digital receiving path post-stage, thereby saving demodulators.

BRIEF DESCRIPTIONS OF THE DRAWINGS

DETAILED DESCRIPTIONS OF THE EMBODIMENTS

The invention is described below in detail with reference to the accompanying drawings and embodiments.

In the invention, a multi-branch correcting and switching module is added into a receiver, and corrects an amplitude and a phase of a signal outputted from a multi-branch correction preprocess module, selects a branch according to conditions of various branch signals before correction, and outputs a signal from the selected branch to a digital receiving path for further digital processing to output a bit stream.

Figure 1:
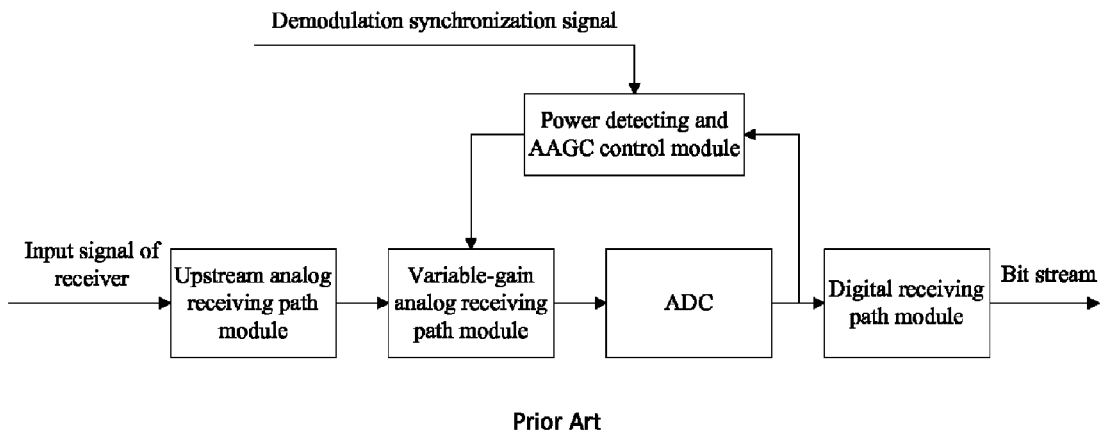
FIG. 1 is a diagram showing basic structure of a receiver deploying the single variable-gain branch technology.
Figure 2:
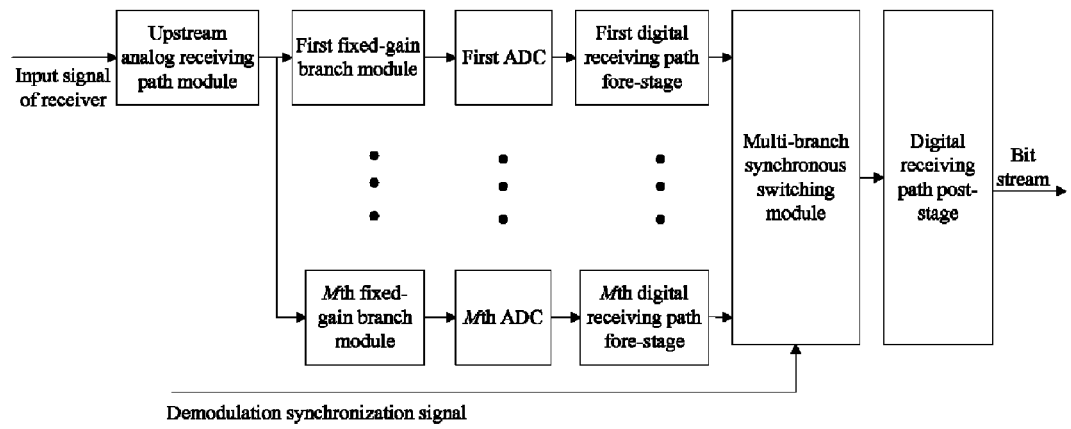
FIG. 2 is a diagram showing basic structure of a multi-fixed-gain-branch receiver which switches before demodulation.
Figure 3:
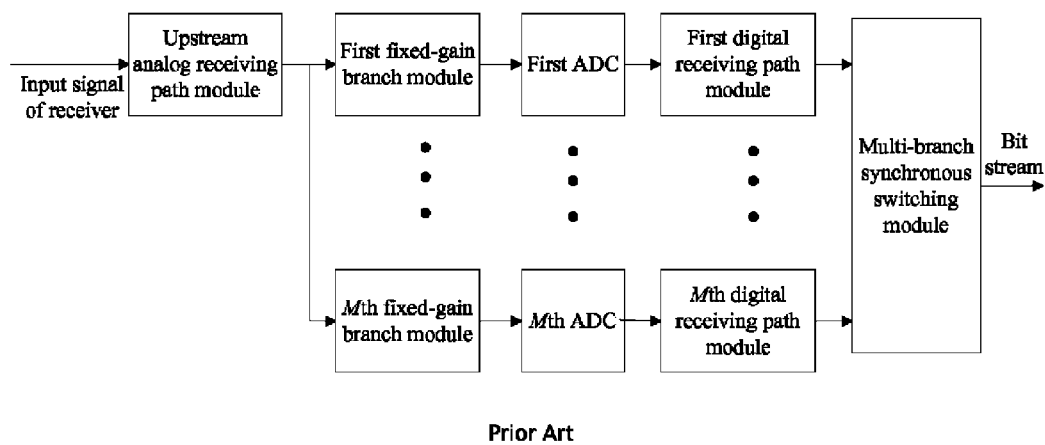
FIG. 3 is a diagram showing basic structure of a multi-fixed-gain-branch receiver which switches after demodulation.
Figure 4:
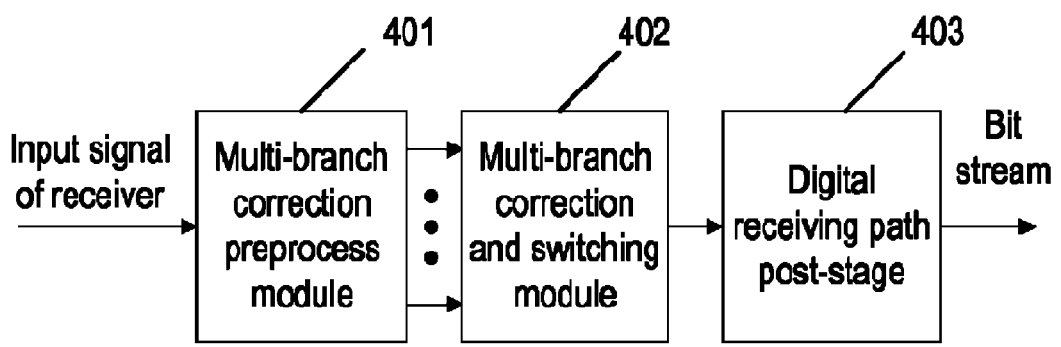
FIG. 4 is a diagram showing basic structure of a receiver, according to an embodiment of the present invention.

FIG. 4 is a diagram showing the basic structure of the receiver, according to an embodiment of the present invention. As shown in FIG. 4, the receiver according to the embodiments of the invention includes at least:

a multi-branch correction preprocess module 401, a multi-branch correcting and switching module 402, and a digital receiving path post-stage 403.

The multi-branch correction preprocess module 401 subjects the input signal of the receiver to M branches of ladder gain processing and digital baseband acquisition process to output M digital baseband signals to the multi-branch correcting and switching module 402.

The digital baseband acquisition process typically includes I&Q demodulation and sampling, and may further include amplification and frequency mixing.

The multi-branch correcting and switching module 402 corrects an amplitude and a phase of each of M digital baseband signals outputted from the multi-branch correction preprocess module 401, selects a digital baseband signal according to a switching strategy, and outputs the selected digital baseband signal to the digital receiving path post-stage 403.

The digital receiving path post-stage 403 is adapted to perform further digital processing on the digital baseband signal outputted from the multi-branch correcting and switching module 402 obtain and output a bit stream.

Figure 5:
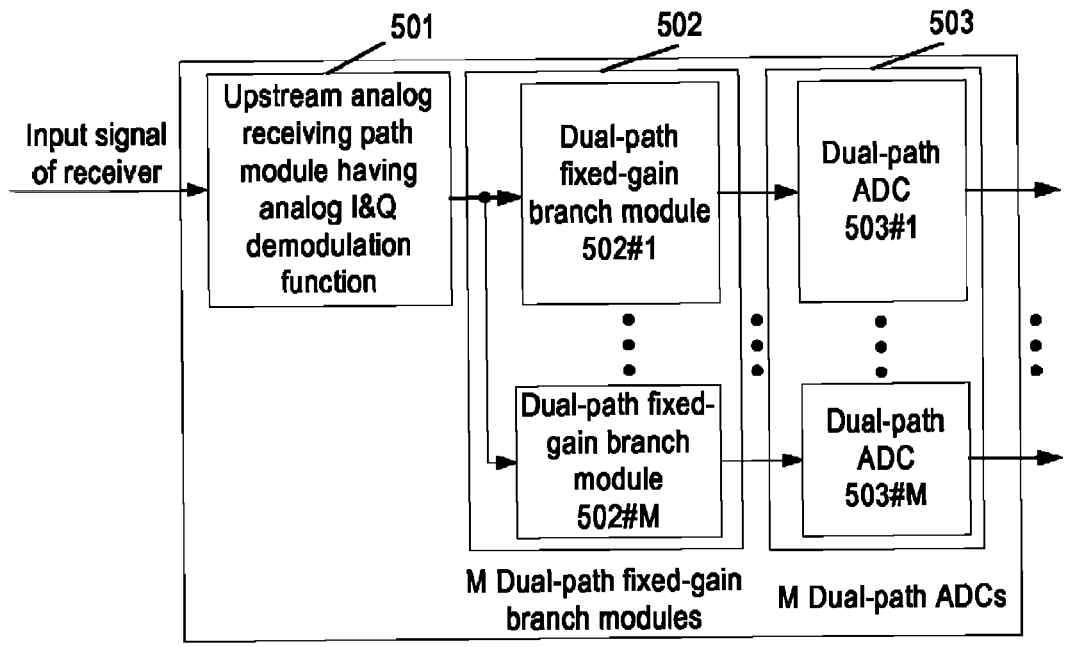
FIG. 5 is a schematic diagram showing a first internal structure of a multi-branch correction preprocess module, according to an embodiment of the present invention.
Figure 6:
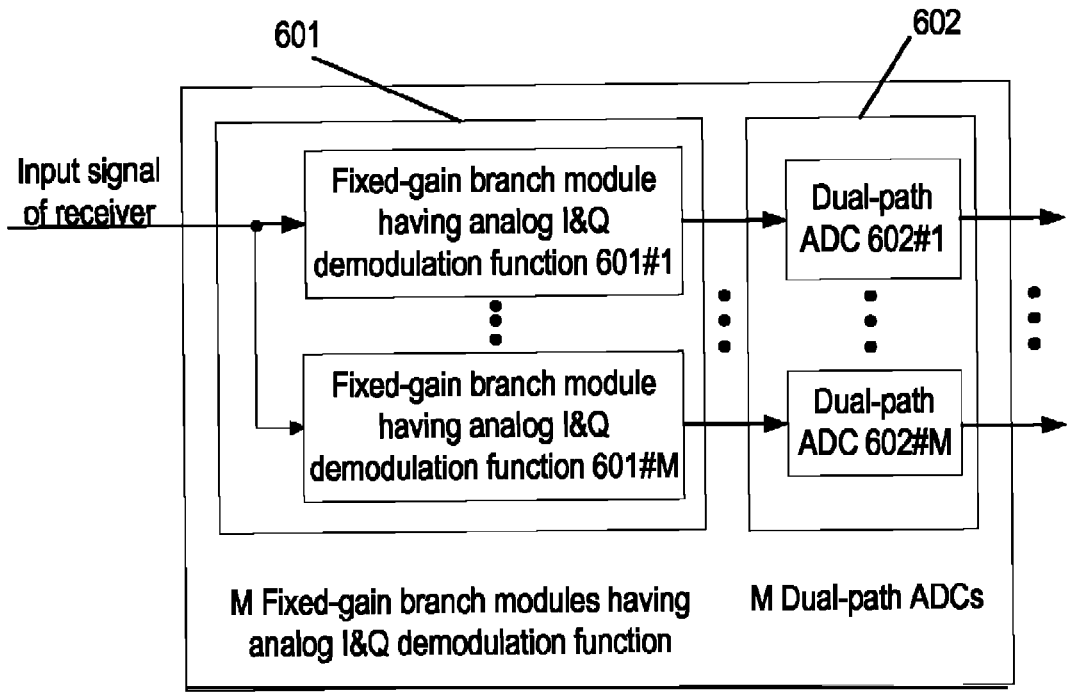
FIG. 6 is a schematic diagram showing a second internal structure of the multi-branch correction preprocess module, according to an embodiment of the present invention.
Figure 7:
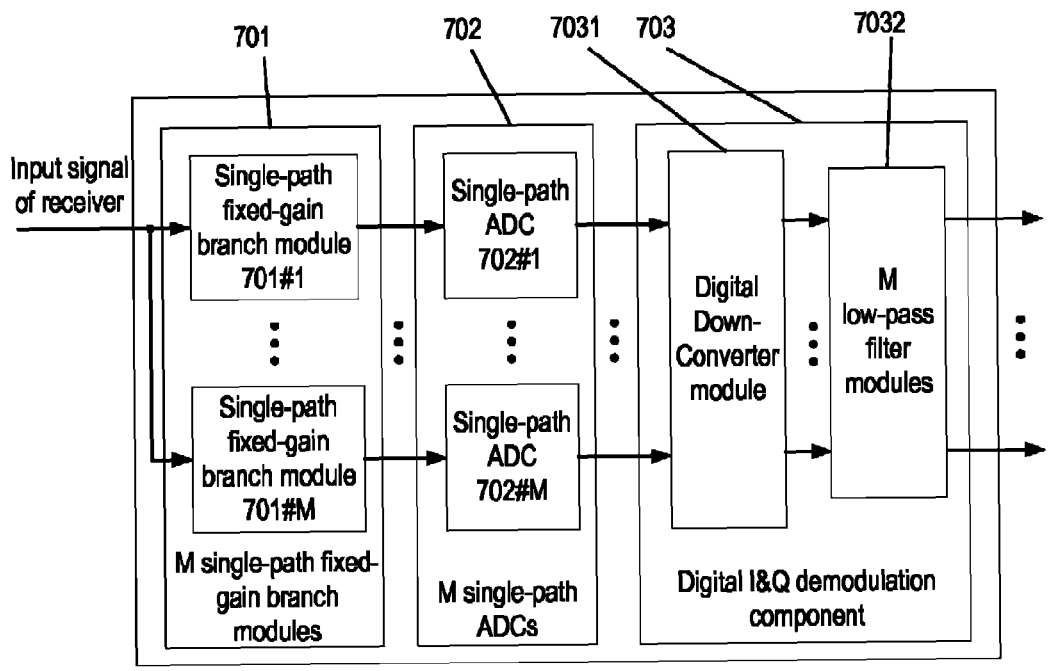
FIG. 7 is a schematic diagram showing a third internal structure of the multi-branch correction preprocess module, according to an embodiment of the present invention.

In the embodiments of the invention, the input signal of the receiver is an analog band-pass signal from a sensor, such as a receiver antenna, and may contain a single carrier with a certain bandwidth, or a plurality of carriers with the same bandwidth, or even a plurality of carriers each with a different bandwidth. The input signal of the receiver needs firstly to be processed by the multi-branch correction preprocess module 401 to obtain M digital baseband signals. The procedure of processing the input signal of the receiver to obtain M digital baseband signals is relatively complex, for the sake of description, the components for processing the input signal of the receiver to obtain M digital baseband signals are generally referred to as the multi-branch correction preprocess module 401 in the embodiments of the invention. The multi-branch correction preprocess module 401 may be constructed in various manners. FIGS. 5, 6, and 7 show constructions of the multi-branch correction preprocess module 401 dependent upon the digital baseband acquisition manner. The digital baseband acquisition means a procedure of obtaining digital baseband signals, i.e. digital I&Q signals, from an analog band-pass signal.

As shown in FIG. 5, the multi-branch correction preprocess module 401 may include an upstream analog receiving path module 501 having a function of analog I&Q demodulation, M dual-path fixed-gain branch modules 502, and M dual-path ADCs 503.

The upstream analog receiving path module 501 having the function of analog I&Q demodulation includes a low noise amplifier and an analog I&Q demodulating component, and may further include components, such as a frequency mixer and a filter. The upstream analog receiving path module 501 amplifies the input signal, demodulates an analog band-pass signal as an analog baseband signal, and outputs the analog baseband signal to the M dual-path fixed-gain branch modules 502.

The M dual-path fixed-gain branch modules 502, including dual-path fixed-gain branch modules 502#1 to 502#M, are adapted to perform the ladder gain processing on the analog baseband signal outputted from the upstream analog receiving path module 501, and output the obtained M analog baseband signals to the M dual-path ADCs 503.

The M dual-path ADCs 503, including dual-path ADCs 503#1 to 503#M, are adapted to sample and convert the analog baseband signals outputted from the M dual-path fixed-gain branch modules 502 into digital baseband signals, and output the digital baseband signals to the multi-branch correcting and switching module 402.

Alternatively, as shown in FIG. 6, the multi-branch correction preprocess module 401 may include M fixed-gain branch modules 601 each having a function of analog I&Q demodulation and M dual-path ADCs 602.

The M fixed-gain branch modules 601, including fixed-gain branch modules 601#1 to 601#M each having the function of analog I&Q demodulation, are adapted to perform the ladder gain processing having the function of analog I&Q demodulation on the input signal of the receiver, and output the obtained M analog baseband signals to the M dual-path ADCs 602.

The M dual-path ADCs 602, including dual-path ADCs 602#1 to 602#M, are adapted to sample and convert the M analog baseband signals outputted from the M fixed-gain branch modules 601 to M digital baseband signals, and output the M digital baseband signals to the multi-branch correcting and switching module 402.

An upstream analog receiving path module without the function of analog I&Q demodulation may be further included in FIG. 6, and connected similar to the upstream analog receiving path module 501 having the function of analog I&Q demodulation as shown in FIG. 5, except that the function of outputting analog I&Q signals after the analog I&Q demodulation is not included and an analog band-pass signal is outputted.

Alternatively, as shown in FIG. 7, the multi-branch correction preprocess module may include M single-path fixed-gain branch modules 701, M single-path ADCs 702, and a digital I&Q demodulation component 703.

The M single-path fixed-gain branch modules 701 and the M single-path ADCs 702 have the same functions and connection relationships as those in FIG. 6, except that the analog band-pass signals, instead of the analog I&Q signals, are processed.

The digital I&Q demodulation component 703 includes a DDC module 7031 and M low-pass filter modules 7032. The DDC module 7031 includes a DDC multiplier and a Numerical Controlled Oscillator (NCO), and shifts a spectrum of the digital band-pass signals outputted from the M single-path ADCs 702 to baseband, i.e. a frequency band centered about 0 Hz, and transfers the processed digital band-pass signals to the M low-pass filter modules 7032 for low-pass filtering processing to obtain M digital baseband signals, i.e. M digital complex signals, which are represented by digital I&Q signals. The signals shifted to baseband are divided into two parallel branches of I and Q, i.e. I signal and Q signal, which are inputted respectively into the low-pass filter modules 7032 for low-pass filtering processing, to filter out digital mirrors and other interference signals to obtain M digital I&Q signals. The modulus of the digital I&Q signals reflects directly the envelope shape of the input signal of the receiver, and therefore is also referred to as a complex envelope. I and Q signals are illustrated as a complex signal in FIG. 7, instead of separate signals.

Figures 8A, 8B:
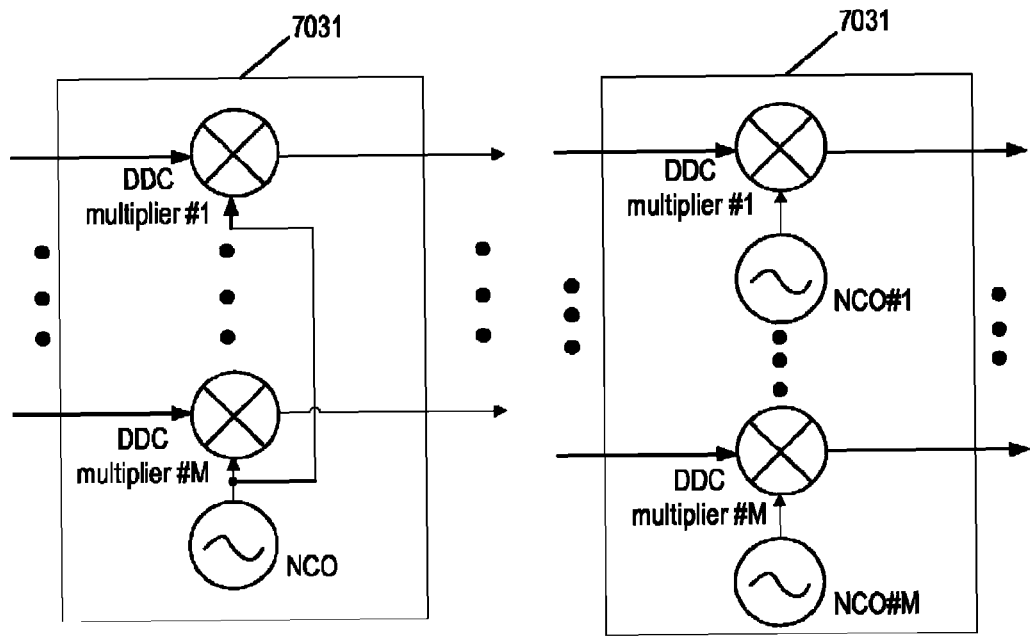
FIG. 8a is a schematic diagram showing a first internal structure of a Digital Down-Converter (DDC) module, according to an embodiment of the present invention.
FIG. 8b is a schematic diagram showing a second internal structure of a DDC module, according to an embodiment of the present invention.

Additionally, FIGS. 8*a* and 8*b* each show an internal structure of the DDC module 7031. As shown in FIG. 8*a*, the DDC module 7031 includes M DDC multipliers and a NCO. The M DDC multipliers multiply each of the M digital band-pass signals outputted from the M single-path ADCs 702 by a digital local oscillator signal outputted from a common NCO to shift the spectrum, and output the product to the M low-pass filter modules 7032. Alternatively, as shown in FIG. 8*b*, the DDC module 7031 includes M DDC multipliers and M NCOs, which are similar to those shown in FIG. 8*a*, except that each of the DDC multipliers is provided with a separate NCO, and description thereof is omitted.

An upstream analog receiving path module without the function of analog I&Q demodulation may be further included in FIG. 7, and connected in a way similar to the upstream analog receiving path module 501 having the function of analog I&Q demodulation as shown in FIG. 5, except that the function of outputting analog I&Q signals after the analog I&Q demodulation is not included and an analog band-pass signal is outputted.

As can be seen, the input signal of the receiver, which is generally an analog band-pass signal, is required to be converted by the multi-branch correction preprocess module 401 to a digital baseband signal. Whether the I&Q demodulation is performed at the analog signal processing stage or the digital signal processing stage is dependent upon actual design of the receiver, and exhaustive description thereof is omitted.

The digital processing performed by the digital receiving path post-stage 403 is dependent upon the input signal of the receiver. For example, in the case of a multi-carrier receiver, the digital receiving path post-stage 403 needs to carry out multiple procedures each including processing such as down-conversion, filtering, decimation, and demodulation, and output multiple bit streams. However, in the case of a single-carrier receiver, the digital receiving path post-stage 403 needs to carry out only one procedure including processing, such as filtering, decimation, and demodulation, and output one bit stream.

In the embodiments of the invention, the M fixed-gain branches in the multi-branch correction preprocess module 401 may be fixed-gain branches each having the function of analog I&Q demodulation, dual-path fixed-gain branch modules, or single-path fixed-gain branch modules. Demodulation to analog baseband is performed only once in the entire receiving path; therefore, single-path analog processing is performed before the analog I&Q demodulation function and dual-path analog processing is performed after the analog I&Q demodulation function. The dual-path fixed-gain branch module is located after the analog I&Q demodulation function and has two parallel paths used to process I and Q analog low-pass signals, respectively, and no frequency mixing stage is provided in the processing path because the I and Q analog low-pass signals have been shifted to the baseband through frequency mixing. Both an input and an output of the single-path fixed-gain branch module are analog band-pass signals, but the frequency of the output signal may be different from that of the input signal. In other words, one or more frequency mixing processing stages may be provided in the processing path. In either the dual-path fixed-gain branch module or the single-path fixed-gain branch module, the M branches each have a fixed gain, and the M branches form a certain gain step so that signals outputted from the M branches at the same point of time have different amplitudes if the signals are not saturated. For example, the signal outputted from the first branch has the largest amplitude, and the signal outputted from the second branch has the second-largest amplitude, and so on.

There are two ladder gain processing approaches, i.e. a parallel ladder gain processing approach and a cascaded ladder gain processing approach. In the parallel ladder gain processing approach, each fixed-gain branch module has a different gain, and all the M branches are parallel. The cascaded ladder gain processing approach is shown in FIG. 9.

Figure 9:
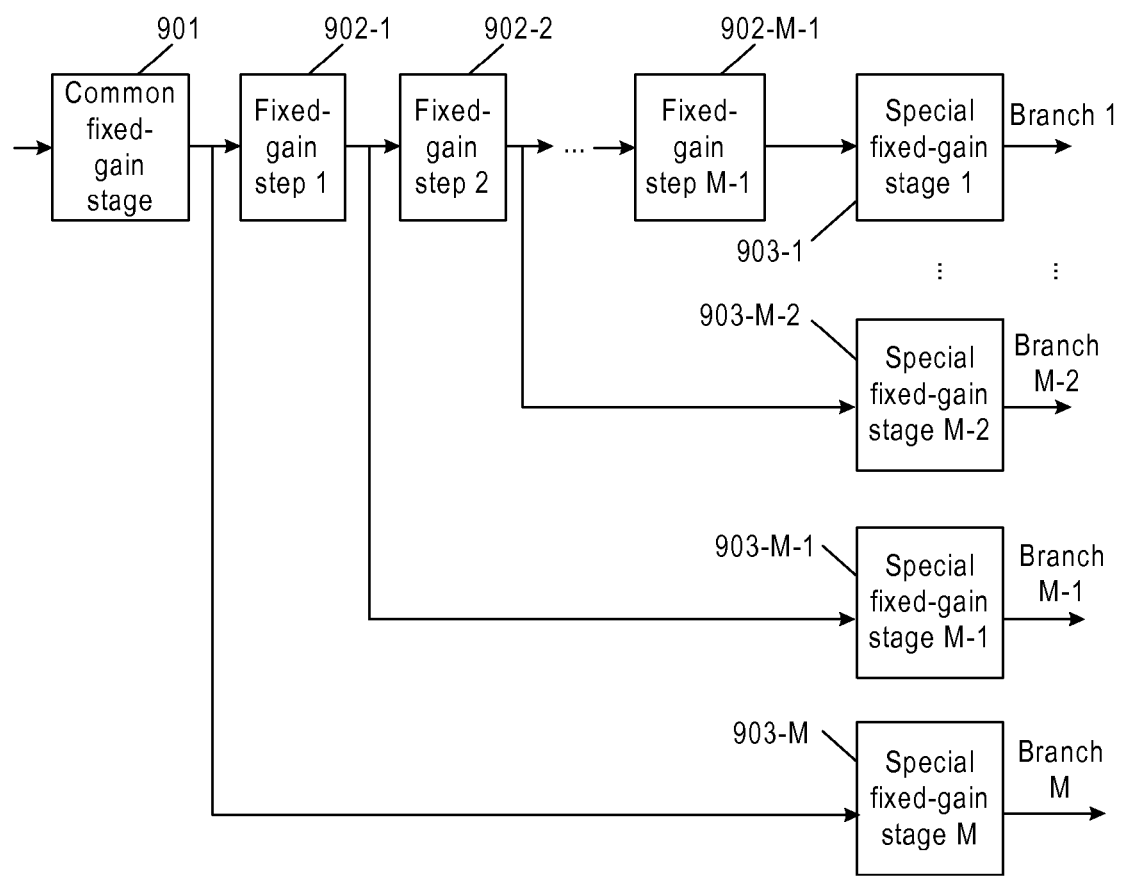
FIG. 9 is a schematic diagram showing an internal structure of a cascaded ladder fixed-gain module, according to an embodiment of the present invention.

As shown in FIG. 9, a common fixed-gain stage module 901 is shared by all the branches. A gain difference between various branches is caused by a fixed-gain step 1 module 902-1~a fixed-gain step M-1 module 902-M-1. Gains of a special fixed-gain stage 1 module 903-1~a special fixed-gain stage M module 903-M may be the same, or different to provide a further gain difference.

All modules shown in FIG. 9 may include a frequency mixing stage. To reduce circuitry complexity and improve sharing of resources, all frequency mixing stages are arranged in the common fixed-gain stage or a more upstream circuit shown in FIG. 9, as long as the performance requirement is satisfied. In this way, the most receiver resources are saved, which is fully possible in the case where a gain difference between a branch with the largest gain and a branch with the least gain is not large. If frequency mixing stages are provided in the fixed-gain step 1 module ~ the fixed-gain step M-1 module in the case where the gain difference between the branch with the largest gain and the branch with the least gain is large, a corresponding frequency mixing stage must be added to the special gain stages connected to intermediate taps, to make all the branches have the same output frequency.

Figure 10:
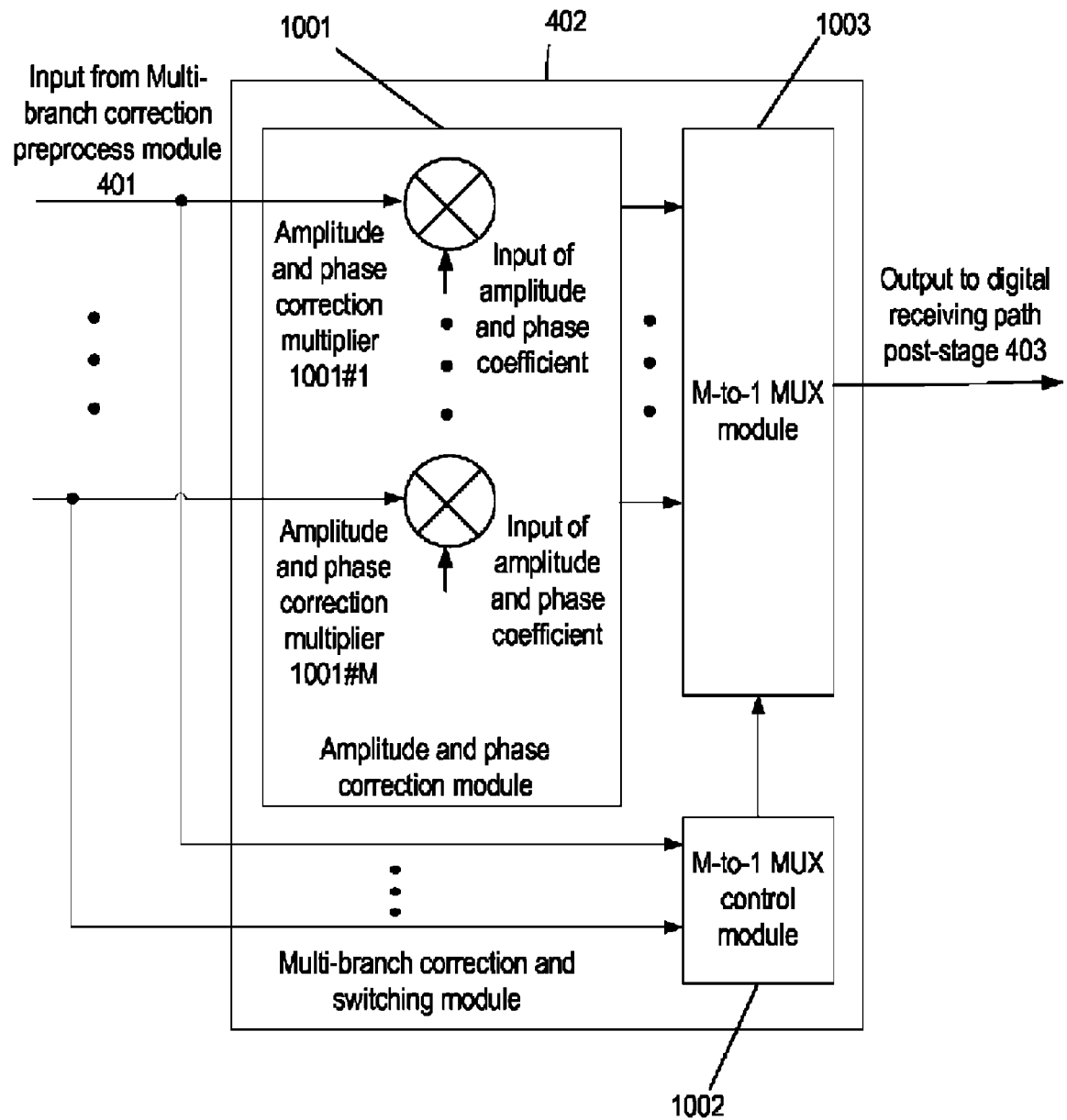
FIG. 10 is a schematic diagram showing an internal structure of a multi-branch correcting and switching module, according to an embodiment of the present invention.

FIG. 10 shows the internal structure of the multi-branch correcting and switching module 402. The multi-branch correcting and switching module 402 at least includes an amplitude and phase correcting module 1001, a M-to-1 Multiplexer (M-to-1 MUX) control module 1002, and a M-to-1 MUX module 1003.

The amplitude and phase correcting module 1001 includes M amplitude and phase correction multipliers, i.e. amplitude and phase correction multipliers 1001#1~1001#M, and obtains corrected M digital baseband signals using M digital baseband signals outputted from the multi-branch correction preprocess module 401 and an amplitude and phase correction coefficient stored in the amplitude and phase correcting module 1001, and outputs the corrected M digital baseband signals to the M-to-1 MUX module 1003.

The M-to-1 MUX control module 1002 determines, according to a switching strategy, a branch from the M digital baseband signals outputted from the multi-branch correction preprocess module 401, and generates and outputs a switching control signal carrying an index of the selected branch to the M-to-1 MUX module 1003.

The M-to-1 MUX module 1003 selects one of the M digital baseband signals outputted from the amplitude and phase correction module 1001, according to the switching control signal outputted from the M-to-1 MUX control module 1002, and outputs the selected digital baseband signal to the digital receiving path post-stage 403.

In the embodiments of the invention, to correct the M digital baseband signals outputted from the multi-branch correction preprocess module 401 in the amplitude and phase correction module 1001, a corresponding amplitude and phase correction coefficient is configured for each branch. The amplitude and phase correction multiplier multiplies the digital baseband signal which is a complex by the amplitude and phase correction coefficient which is a complex to change the amplitude and phase of the digital baseband signal, so that all branch digital baseband signals whose amplitudes are sufficiently large but not saturated have the same amplitudes and phases. For a branch whose signal amplitude is too small or too large so that the amplitude is lower than the sensitivity or is saturated, the amplitude and phase of the signal of the branch cannot be made consistent with those of a normal branch even after correction. However, such a branch is not to be selected as a branch outputting the corrected digital baseband signal according to the switching strategy, so the description of the correction of such a branch is omitted.

In the embodiments of the invention, the amplitude and phase correction coefficient may be configured offline, where initial values of M amplitude and phase correction coefficients are configured in advance for the amplitude and phase correction module 1001 before the receiver starts to receive wireless signals, and the amplitude and phase correction coefficients are maintained constant during the operation of the receiver. To configure the initial values of M amplitude and phase correction coefficients in advance for the amplitude and phase correction module before the receiver starts to receive wireless signals, the initial values of M amplitude and phase correction coefficients which are calculated according to measurements are programmed into the amplitude and phase correction module when the receiver is in the factory; alternatively, the initial values of M amplitude and phase correction coefficients are calculated using a test signal when the receiver is powered on and are all configured into the amplitude and phase correction module. In the invention, the offline configuration mode is applicable to the case where relative characteristics of the various branch circuits of the receiver are stable. The relative characteristic means a transfer function ratio between two branches, and the relative characteristic between M branches means a transfer function ratio between M branches. If the output signal of a branch has a large amplitude but is not saturated, the circuit may be regarded as linear and may be described with a transfer function.

Alternatively, the amplitude and phase correction coefficient may be configured online, where the initial values of the amplitude and phase correction coefficients are calculated using the input signal when the receiver is powered on, and configured into the amplitude and phase correction module. Subsequently, the amplitude and phase correction coefficients are calculated periodically or aperiodically in the receiver, to compensate drifts of the relative circuitry characteristics among the branches. In the invention, the online configuration mode is applicable to the case where relative circuitry characteristics of the various branches of the receiver are not stable.

It should be noted that the each of the M amplitude and phase correction multipliers in the amplitude and phase correction module 1001 has two input ports, a digital baseband signal is inputted by the multi-branch correction preprocess module 401 via one of the two input ports, and an amplitude and phase correction coefficient is inputted by an amplitude and phase correction coefficient register within the amplitude and phase correction module 1001 via the other of the two input ports.

In the offline configuration mode, the initial values of the amplitude and phase correction coefficients may be written into the amplitude and phase correction coefficient register once for all. In the online configuration mode, the new calculated amplitude and phase correction coefficients are written into the amplitude and phase correction coefficient register continually.

Further, in the embodiments of the invention, the M amplitude and phase correction coefficients may be calculated using similar methods, i.e. an amplitude and phase correction coefficient calculating method, in the offline configuration mode and the online configuration mode.

A First Embodiment of the Device

In the present embodiment, relative circuitry characteristics of various branches are stable. Initial values of amplitude and phase correction coefficients are calculated and written once for all, before the receiver starts to receive traffic signals. In other words, an offline configuration mode is deployed. Further, the values of the amplitude and phase correction coefficients are not changed during the operation of the receiver.

Figure 11:
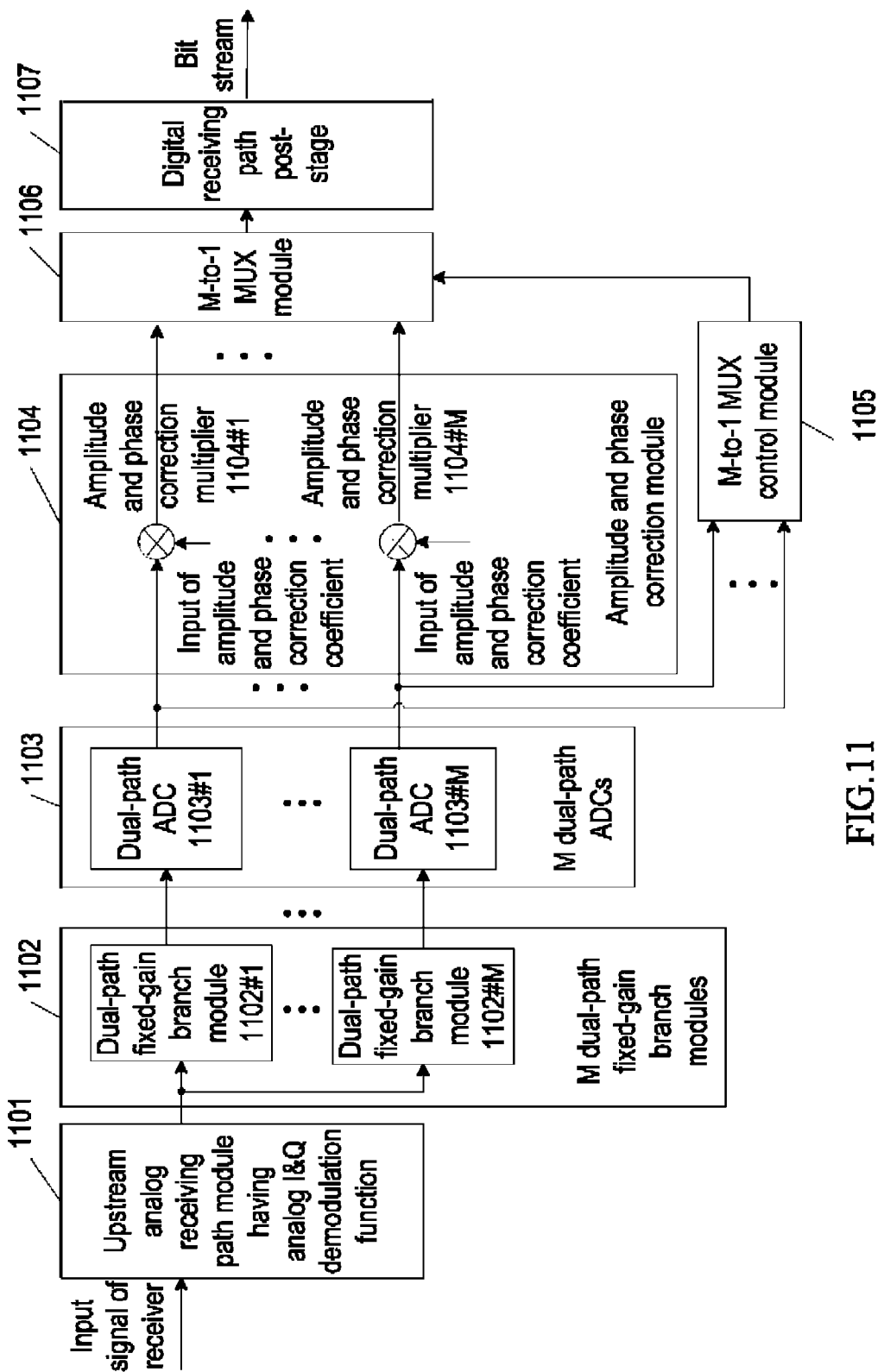
FIG. 11 is a schematic diagram showing the structure, according to a first embodiment of the device in the present invention.

As shown in FIG. 11, the receiver in this embodiment includes an upstream analog receiving path module 1101 having a function of analog I&Q demodulation, M dual-path fixed-gain branch modules 1102, M dual-path ADCs 1103, an amplitude and phase correction module 1104, a M-to-1 MUX control module 1105, a M-to-1 MUX module 1106, and a digital receiving path post-stage 1107.

The upstream analog receiving path module 1101 having the function of analog I&Q demodulation, which includes a low noise amplifier and an analog I&Q demodulating component, performs upstream analog receiving processing having the analog I&Q demodulation function, i.e. processing such as amplification and frequency mixing, on the input signal of the receiver, demodulates an analog band-pass signal into an analog baseband signal, and outputs the analog baseband signal to the M dual-path fixed-gain branch modules 1102.

The M dual-path fixed-gain branch modules 1102, which include dual-path fixed-gain branch modules 1102#1 to 1102#M, perform ladder gain processing on the analog baseband signal outputted from the upstream analog receiving path module 1101, and output the processed M analog baseband signals to the M dual-path ADCs 1103. Each of the analog baseband signals is a complex signal including parallel I and Q analog signals.

The M dual-path ADCs 1103, including dual-path ADCs 1103#1 to 1103#M, sample and convert the analog baseband signals outputted from the M dual-path fixed-gain branch modules 1102 to digital baseband signals, and output respectively the digital baseband signals to the amplitude and phase correction module 1104 and the M-to-1 MUX control module 1105.

The amplitude and phase correcting module 1104, which includes amplitude and phase correction multipliers 1104#1 to 1104#M, obtains corrected digital baseband signals using digital baseband signals outputted from the M dual-path ADCs 1103 and an amplitude and phase correction coefficient configured in advance, and outputs the corrected digital baseband signals to the M-to-1 MUX module 1106.

The M-to-1 MUX control module 1105 determines, according to a switching strategy of the invention, a branch from the M digital baseband signals outputted from the M dual-path ADCs 1103, and generates and outputs a switching control signal carrying an index of the selected branch to the M-to-1 MUX module 1106.

The M-to-1 MUX module 1106 selects one of the M digital baseband signals outputted from the amplitude and phase correction module 1104 according to the switching control signal outputted from the M-to-1 MUX control module 1105, and outputs the selected digital baseband signal to the digital receiving path post-stage 1107.

The digital receiving path post-stage 1107 performs further digital processing on the corrected digital I&Q baseband signal outputted from the M-to-1 MUX module 1106, to obtain and output a bit stream.

When the wireless signal is received by the receiver, the upstream analog receiving path module 1101 performs processing such as amplification and analog I&Q demodulation on the receiver input signal which is an analog band-pass signal, to obtain and output an analog baseband signal to the M dual-path fixed-gain branch modules 1102. In the dual-path fixed-gain branch modules 1102, the M analog I&Q signals are subjected to the ladder gain processing by the respective dual-path fixed-gain branch modules, and outputted to the M dual-path ADCs 1103. The M dual-path ADCs 1103 sample the inputted M analog baseband signals to obtain digital baseband signals, and output the obtained digital baseband signals to the amplitude and phase correction module 1104 and the M-to-1 MUX control module 1105. The amplitude and phase correction module 1104 corrects amplitudes and phases of the inputted signals so that the digital baseband signals of the branches are consistent with each other in terms of amplitude and phase, and outputs the corrected signals to the M-to-1 MUX module 1106. The M-to-1 MUX control module 1105 determines a branch where the signal has the largest amplitude but is not saturated according to the M digital baseband signals outputted from the M dual-path ADCs 1103 and the switching strategy, and notifies the M-to-1 MUX module 1106 of the branch via a switching control signal carrying an index of the branch. The M-to-1 MUX module 1106 selects a corrected digital baseband signal according to the switching control signal outputted from the M-to-1 MUX control module 1105, and outputs the selected digital baseband signal to the digital receiving path post-stage 1107. The digital receiving path post-stage 1107 performs further digital processing, such as filtering, decimation, and demodulation on the corrected digital baseband signal outputted from the M-to-1 MUX module 1106, and obtains and outputs the bit stream.

In practice, it is also possible that the receiver may not include the upstream analog receiving path module 1101 having the function of analog I&Q demodulation, and the M dual-path fixed-gain branch modules 1102 are replaced with M fixed-gain branch modules having the function of analog I&Q demodulation, to implement the solution of the invention.

Through the embodiment of the invention, branch digital baseband signals, which have sufficiently large amplitudes but are not saturated, are consistent with each other in terms of amplitude and phase, and switching can be performed on a sample by sample basis, so that the signal change can be traced rapidly.

A Second Embodiment of the Device

In the present embodiment, initial values of amplitude and phase correction coefficients are configured in an online configuration mode in a receiver, new amplitude and phase correction coefficients are calculated and written continually, according to a change on the input signal of the receiver during the operation of the receiver.

Figure 12:
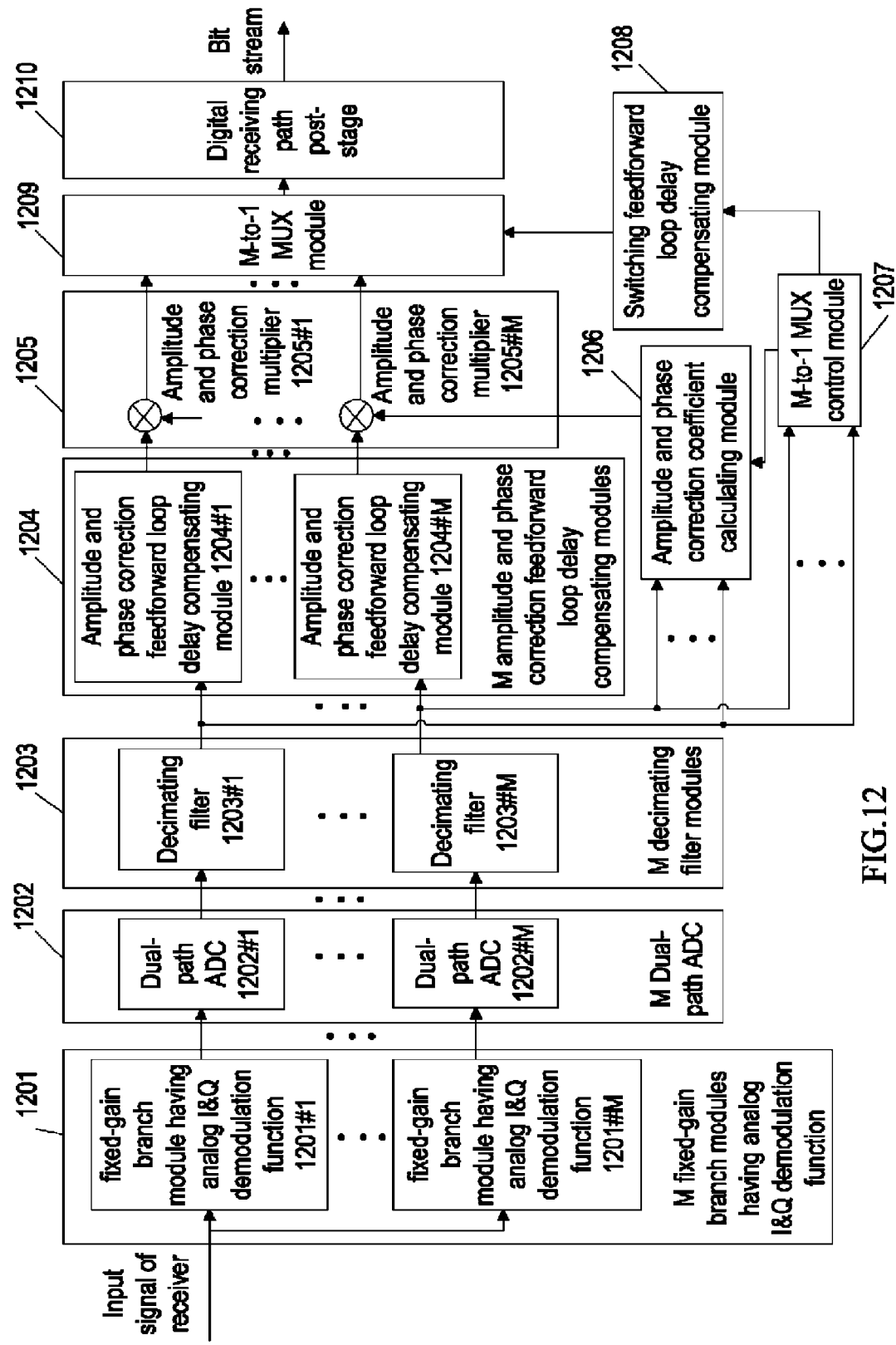
FIG. 12 is a schematic diagram showing the structure, according to a second embodiment of the device in the present invention.

As shown in FIG. 12, the receiver in this embodiment includes M fixed-gain branch modules 1201 each having a function of analog I&Q demodulation, M dual-path ADCs 1202, M decimating filter modules 1203, M amplitude and phase correction feedforward loop delay compensating modules 1204, an amplitude and phase correction module 1205, an amplitude and phase correction coefficient calculating module 1206, a M-to-1 MUX control module 1207, a switching feedforward loop delay compensating module 1208, a M-to-1 MUX module 1209, and a digital receiving path post-stage 1210.

The M fixed-gain branch modules 1201 each having the function of analog I&Q demodulation, M dual-path ADCs 1202, the amplitude and phase correction module 1205, the M-to-1 MUX control module 1207, and the M-to-1 MUX module 1209 have functions similar to those of the corresponding modules described in the first embodiment of the device, except that the M fixed-gain branch modules 1201 can not only perform ladder gain processing on the input signal of the receiver, but also perform the analog I&Q demodulation, and the M-to-1 MUX control module 1207 further generates a switching flag signal according to a switching strategy.

In the embodiment, the M decimating filter modules 1203 decimate digital baseband signals outputted from the M dual-path ADCs 1202, and output the decimated digital baseband signals to the M amplitude and phase correction feedforward loop delay compensating modules 1204, the amplitude and phase correction coefficient calculating module 1206 and the M-to-1 MUX control module 1207, respectively.

The M amplitude and phase correction feedforward loop delay compensating modules 1204 apply delay compensation of the digital baseband signals outputted from the M decimating filter modules 1203, and output the compensated digital baseband signals to the amplitude and phase correction module 1205.

The amplitude and phase correction coefficient calculating module 1206 calculates amplitude and phase correction coefficients using the digital baseband signals outputted from the M decimating filter modules 1203, and outputs the calculated amplitude and phase correction coefficients to the amplitude and phase correction module 1205, according to the switching flag signal outputted from the M-to-1 MUX control module 1207.

In practice, the amplitude and phase correction coefficient calculating module 1206 may further calculate an amplitude and phase correction coefficient using the digital baseband signals subjected to amplitude and phase correction that are outputted from the amplitude and phase correction module 1205, and output the calculated amplitude and phase correction coefficient to the amplitude and phase correction module 1205, according to the switching flag signal outputted from the M-to-1 MUX control module 1207, so that a feedback loop is formed. It is noted that when the amplitude and phase correction coefficient calculating module 1206 calculates the amplitude and phase correction coefficient using the digital baseband signals outputted from the amplitude and phase correction module 1205, an effect of the original amplitude and phase correction coefficient needs to be removed to calculate new amplitude and phase correction coefficient because the digital baseband signals has been subjected to the amplitude and phase correction.

The switching feedforward loop delay compensating module 1208 applies delay compensation of the switching control signal outputted from the M-to-1 MUX control module 1207, and outputs the compensated switching control signal to the M-to-1 MUX module 1209.

In the embodiment, when the wireless signal is received by the receiver, the input signal of the receiver is inputted to the M fixed-gain branch modules 1201 each having a function of analog I&Q demodulation, and subjected to processing such as the ladder gain processing and the analog I&Q demodulation, so that analog baseband signals are obtained and outputted to the M dual-path ADCs 1202. The M dual-path ADCs 1202 samples the inputted M analog baseband signals to obtain digital baseband signals, and outputs the obtained digital baseband signals to the M decimating filter modules 1203. The digital baseband signals are decimated by the M decimating filter modules 1203, and outputted to the M amplitude and phase correction feedforward loop delay compensating modules 1204, the amplitude and phase correction coefficient calculating module 1206 and the M-to-1 MUX control module 1207, respectively. The M amplitude and phase correction feedforward loop delay compensating modules 1204 delays the signals inputted, and outputs the delayed signals to the amplitude and phase correction module 1205. M amplitude and phase correction coefficients are calculated by the amplitude and phase correction coefficient calculating module 1206 using the M digital baseband signals outputted from the M decimating filter modules 1203. The M-to-1 MUX control module 1207 determines a branch according to the switching strategy, generates, and outputs a switching control signal to the switching feedforward loop delay compensating module 1208 and then to the M-to-1 MUX module 1209. Furthermore, the M-to-1 MUX control module 1207 generates a switching flag signal after determining whether to switch to a new branch, and outputs the switching flag signal to the amplitude and phase correction coefficient calculating module 1206. The amplitude and phase correction coefficient calculating module 1206 configures the calculated M amplitude and phase correction coefficients for the amplitude and phase correction module 1205, according to the switching flag signal outputted from the M-to-1 MUX control module 1207. The amplitude and phase correction module 1205 multiplies the M digital baseband signals outputted from the M amplitude and phase correction feedforward loop delay compensating modules 1204 by the amplitude and phase correction coefficients outputted from the amplitude and phase correction coefficient calculating module 1206, to make the M branch digital baseband signals consistent with each other in terms of amplitude and phase, so that the amplitude and phase correction is completed; further, the digital baseband signals are outputted to the M-to-1 MUX module 1209. The M-to-1 MUX module 1209 selects a digital baseband signal according to the switching control signal subjected to the delay compensation that is outputted from the switching feedforward loop delay compensating module 1208, and outputs the selected digital baseband signal to the digital receiving path post-stage 1210. The digital receiving path post-stage 1210 performs further digital processing such as decimation, filtering, and demodulation on the digital baseband signal outputted from the M-to-1 MUX module 1209, so that the bit stream is obtained and outputted.

In the embodiment, the amplitude and phase correction coefficients are configured in the online configuration mode, because relative circuitry characteristics of the various branches of the receiver are unstable due to that the branches may change along with the time and temperature. Therefore, the M fixed-gain branch modules 1201 each having a function of analog I&Q demodulation, the M dual-path ADCs 1202, the amplitude and phase correction module 1205, the amplitude and phase correction coefficient calculating module 1206, the M-to-1 MUX control module 1207, the M-to-1 MUX module 1209 and the digital receiving path post-stage 1210 are necessary, while the other modules may be omitted dependent upon the application.

In practice, M decimating filter modules 1203 may be added to save digital resources. In other words, signal to be calculated are decimated so that the throughput rate of signals inputted to the amplitude and phase correction module 1205 and the amplitude and phase correction coefficient calculating module 1206 is lowered, and therefore, the amount of digital processing by the modules are lowered and resource requirements are reduced.

To configure the amplitude and phase correction module 1205 timely with the latest amplitude and phase correction coefficients when the switching happens so that the current sample or the sample used for updating current calculation of the amplitude and phase correction coefficient may be subjected to amplitude and phase correction by the amplitude and phase correction module 1205, the M amplitude and phase correction feedforward loop delay compensating modules 1204 compensate the delay caused by the calculation of the amplitude and phase correction coefficients, as shown in FIG. 12. In practice, in the case where the delay caused by the calculation of the amplitude and phase correction coefficients is smaller than the delay of the amplitude and phase correction module, the M amplitude and phase correction feedforward loop delay compensating modules 1204 may be located between the amplitude and phase correction coefficient calculating module 1206 and the amplitude and phase correction module 1205. In other words, the M amplitude and phase correction feedforward loop delay compensating modules 1204 compensate the delay of the M amplitude and phase correction coefficients outputted from the amplitude and phase correction coefficient calculating module 1206, and output the compensated coefficients to the amplitude and phase correction module 1205. In the case where the delay caused by the calculation of the amplitude and phase correction coefficients is equal to the delay of the amplitude and phase correction module, the M amplitude and phase correction feedforward loop delay compensating modules 1204 may be omitted.

Further, the switching feedforward loop delay compensating module 1208 ensures that the switching control signal and the corrected M digital baseband signals that are corresponding to the same samples may reach the M-to-1 MUX module simultaneously. As shown in FIG. 12, the switching feedforward loop delay compensating module 1208 is located between the M-to-1 MUX control module 1207 and the M-to-1 MUX module 1209, which is in accordance with the case that the total processing delay of the M amplitude and phase correction feedforward loop delay compensating modules 1204 and the amplitude and phase correction module 1205 is larger than the processing delay of the M-to-1 MUX control module 1207.

However, in practice, if the total processing delay of the M amplitude and phase correction feedforward loop delay compensating modules 1204 and the amplitude and phase correction module 1205 is equal to the processing delay of the M-to-1 MUX control module 1207, the switching feedforward loop delay compensation is not necessary. In other words, the switching feedforward loop delay compensating module 1208 is not required.

In practice, if the total processing delay of the M amplitude and phase correction feedforward loop delay compensating modules 1204 and the amplitude and phase correction module 1205 is smaller than the processing delay of the M-to-1

MUX control module 1207, the switching feedforward loop delay compensating module 1208 has to be provided in the signal path. A feedforward loop is formed by the M amplitude and phase correction feedforward loop delay compensating modules 1204, the amplitude and phase correction module 1205 and the amplitude and phase correction coefficient calculating module 1206, and therefore, the switching feedforward loop delay compensating module 1208 is preferably inserted outside the feedforward loop, in order not to couple with the amplitude and phase correction feedforward loop delay compensation. In other words, the connection relationship may be such that the M decimating filter modules 1203 output the decimated M digital baseband signals to the switching feedforward loop delay compensating module 1208 and the M-to-1 MUX control module 1207, the switching feedforward loop delay compensating module 1208 compensates the delay of the M digital baseband signals outputted from the M decimating filter modules 1203 and outputs the compensated digital baseband signals to the M amplitude and phase correction feedforward loop delay compensating modules 1204, while the connection relationships of the other modules remain changed. Alternatively, the connection may be such that the corrected M digital baseband signals are outputted by the amplitude and phase correction module 1205 to the switching feedforward loop delay compensating module 1208, subjected to delay compensation by the switching feedforward loop delay compensating module 1208, and outputted to the M-to-1 MUX module 1209, while the connection relationships of the other modules remain changed. However, signal fixed point bit-width is increased due to an increase of the non-simultaneous dynamic range after the amplitude and phase correction, therefore resources may be saved by arranging the switching feedforward loop delay compensating module 1208 between the M decimating filter modules 1203 and the M amplitude and phase correction feedforward loop delay compensating modules 1204.

In practice, if relative amplitude and phase characteristics among the circuits of the branches are stable, the calculated amplitude and phase correction coefficients can be configured once for all for the amplitude and phase correction module 1205 during the initialization of the receiver and remain unchanged subsequently, and the amplitude and phase correction coefficient calculating module 1206 may be omitted.

In practice, when the switching flag signal outputted from the M-to-1 MUX control module 1207 is received by the amplitude and phase correction coefficient calculating module 1206, the amplitude and phase correction coefficient calculating module 1206 may configure immediately the latest calculated amplitude and phase correction coefficients for the amplitude and phase correction module 1205. Or, the amplitude and phase correction coefficient calculating module 1206 may configure the amplitude and phase correction module 1205 if only new amplitude and phase correction coefficients have been calculated by the amplitude and phase correction coefficient calculating module 1206 after the previous configuration of the amplitude and phase correction coefficients.

A Third Embodiment of the Device

In the present embodiment, initial values of amplitude and phase correction coefficients are configured in the online configuration mode in a receiver, amplitude, and phase correction coefficients may be recalculated using the obtained M digital baseband signals while the receiver receives the wireless signal, and recalculated amplitude and phase correction coefficients are configured for the amplitude and phase correction module, which subsequently performs correction using the recalculated amplitude and phase correction coefficients.

Figure 13:
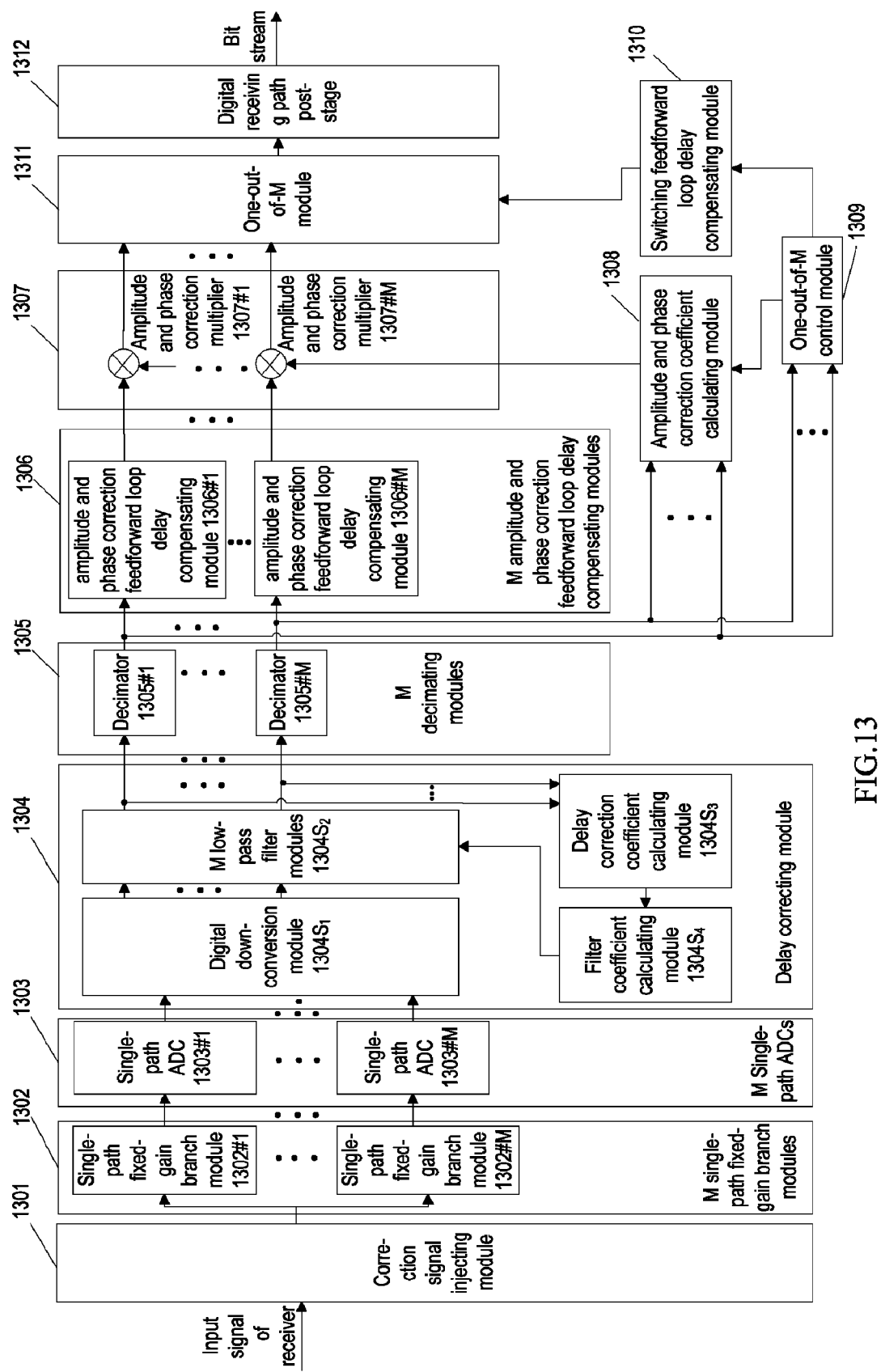
FIG. 13 is a schematic diagram showing the structure, according to a third embodiment of the device in the present invention.

As shown in FIG. 13, the receiver in the embodiment includes a correction signal injecting module 1301, M single-path fixed-gain branch modules 1302, M single-path ADCs 1303, a delay correcting module 1304, M decimating modules 1305, M amplitude and phase correction feedforward loop delay compensating modules 1306, an amplitude and phase correction module 1307, an amplitude and phase correction coefficient calculating module 1308, a M-to-1 MUX control module 1309, a switching feedforward loop delay compensating module 1310, a M-to-1 MUX module 1311, and a digital receiving path post-stage 1312.

The M single-path fixed-gain branch modules 1302, the M single-path ADCs 1303, the M amplitude and phase correction feedforward loop delay compensating modules 1306, the amplitude and phase correction module 1307, the amplitude and phase correction coefficient calculating module 1308, the M-to-1 MUX control module 1309, the switching feedforward loop delay compensating module 1310, the M-to-1 MUX module 1311 and the digital receiving path post-stage 1312 are similar to the corresponding modules in the second embodiment of the device, except that the M decimating modules 1305 decimate the inputted M digital baseband signals directly, with no more filtering; the M single-path fixed-gain branch modules 1302 have no analog I&Q demodulation function; and the M single-path ADCs 1303 each have only one ADC.

Further, in the embodiment, the delay correcting module 1304 includes a DDC module 1304S1, M low-pass filter modules 1304S2, a delay correction coefficient calculating module 1304S3 and a filter coefficient calculating module 1304S4. The delay correcting module 1304 performs digital I&Q demodulation and delay correction on digital band-pass signals outputted from the M single-path ADCs 1303, obtains and outputs M digital baseband signals synchronous with each other to the M decimating modules 1305.

In practice, the DDC module 1304S1 and the M low-pass filter modules 1304S2 are the digital I&Q demodulation component 703 shown in FIG. 7, which is a part of the multi-branch correction preprocess module 401. In the embodiment, the digital I&Q demodulation component 703 is used for delay correction. For the sake of a uniform term, the digital I&Q demodulation component 703, the delay correction coefficient calculating module 1304S3 and the filter coefficient calculating module 1304S4 may be referred generally to as the delay correcting module 1304.

In the embodiment, the delay correcting module 1304 implements the delay correction as follows. The DDC module 1304S1 shifts the spectrum of the digital band-pass signals outputted from the M single-path ADCs 1303 to baseband, and outputs the signals to the M low-pass filter modules 1304S2. The M low-pass filter modules 1304S2 performs low-pass filtering on the inputted signals to filter out digital mirrors and other interference signals, performs delay correction according to a filter coefficient to obtain M digital baseband signals, and outputs the M digital baseband signals to the M decimating modules 1305 and the delay correction coefficient calculating module 1304S3. The delay correction coefficient calculating module 1304S3 calculates delay correction coefficients for the M signals using the M digital baseband signals outputted from the M low-pass filter modules 1304S2, and outputs the delay correction coefficients to the filter coefficient calculating module 1304S4. The filter coefficient calculating module 1304S4 calculates the filter coefficient using the inputted delay correction coefficients, and configures the filter coefficient for the M low-pass filter modules 1304S2.

The digital I&Q signals are described herein as being obtained through the low-pass filtering after the DDC. In practice, the digital I&Q signals may be obtained through the DDC after single sided band-pass filtering. In other words, digital band-pass signals outputted from the M single-path ADCs 1303 may be outputted to M single sided band-pass filter modules, subsequently subjected to the single sided band-pass filtering and delay correction by the M single sided band-pass filter modules, and outputted to the DDC module 1304S1. The single sided band-pass filter is a complex filter, and is based on the Nyquist bandwidth within a frequency range between half of the negative sample frequency and half of the positive sample frequency, and only the signal spectrum in the positive frequency coordinate or the negative frequency coordinate may be kept dependent upon the signal modulation and the receiving and transmitting digital and analog local oscillator settings. The shift of the signal spectrum to baseband is generally referred to as the down-conversion, regardless that the signal spectrum is located at the positive frequency coordinate or the negative frequency coordinate. In this latter structure that the single sided band-pass filtering is followed by the DDC, the filter coefficient for the delay correction is different from that in the previous structure that the DDC is followed by baseband filtering, because the filter type and the processing sequence are different between the two structures.

In practice, if circuitry characteristics of various branches of the receiver are stable, an initial value of the filter coefficient may be configured in the offline configuration mode, which is similar to the mode in which the initial values of the amplitude and phase correction coefficients are configured. In other words, in practice, the delay correction coefficient calculating module 1304S3 and the filter coefficient calculating module 1304S4 may be omitted, and the delay correction coefficients are stored in the M low-pass filters in advance. For example, the delay correction coefficients may be programmed into the low-pass filters through a nonvolatile device such as the EPROM and the FLASH, or written into the low-pass filters upon power-on and reset.

Further, the correction signal injecting module 1301 injects a signal for correction when the receiver is initialized or idle, and outputs the signal to the M single-path fixed-gain branch modules 1302.

Figure 14:
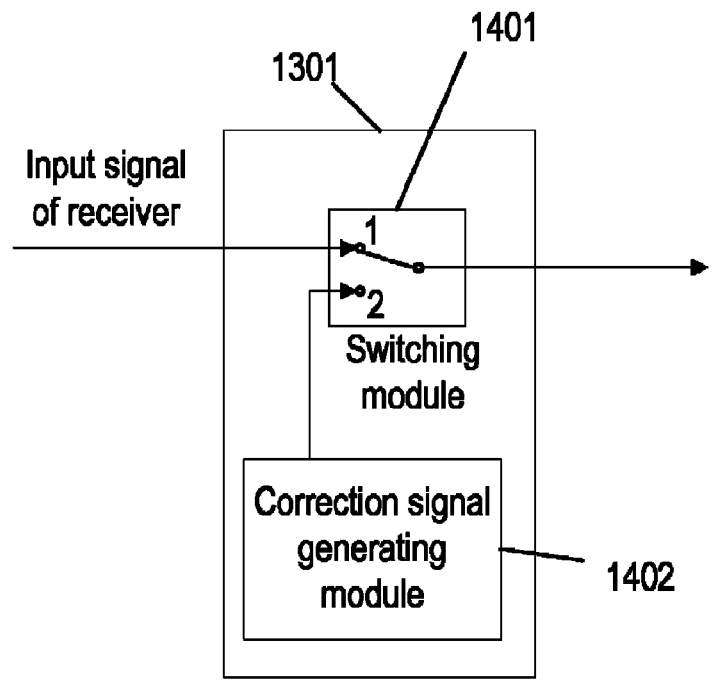
FIG. 14 is a schematic diagram showing a first internal structure of a correction signal injecting module, according to an embodiment of the present invention.
Figure 15:
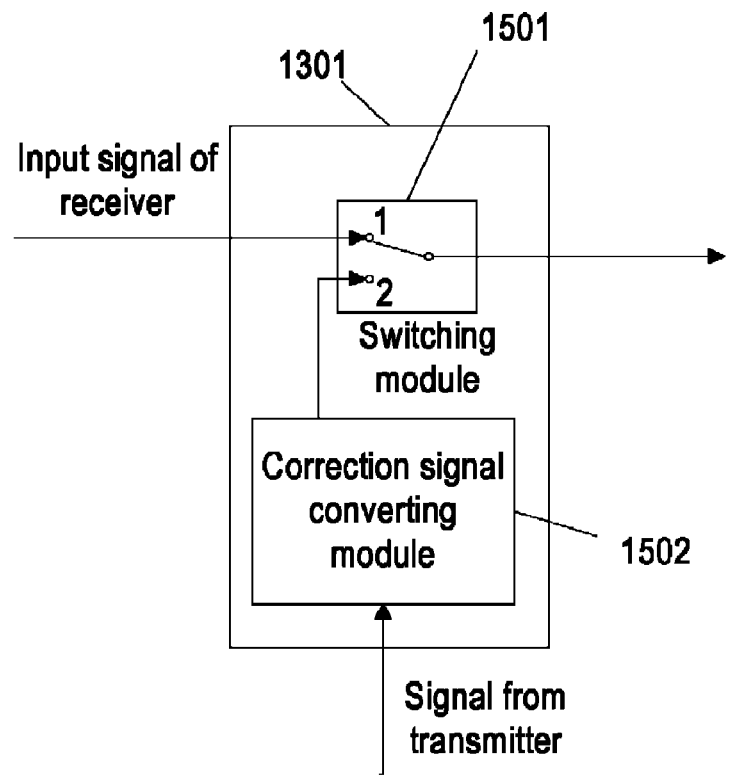
FIG. 15 is a schematic diagram showing a second internal structure of the correction signal injecting module, according to an embodiment of the present invention.

FIGS. 14 and 15 each show an internal block diagram of the correction signal injecting module 1301. As shown in FIG. 14, the correction signal injecting module 1301 includes a switching module 1401 and a correction signal generating module 1402. The switching module 1401 outputs the input signal of the receiver received from a sensor, such as an antenna and a correction signal generated by the correction signal generating module 1402 to the M single-path fixed-gain branch modules 1302. The switching module 1401 needs to transmit the input signal of the receiver and the correction signal described above in a time-division manner. The switching module 1401 needs to output the input signal of the receiver when the input signal is received by the receiver, and output the correction signal when the receiver is initialized or idle to calculate the correction coefficients. In practice, the switching module 1401 may be implemented with an electronic switch, and the correction signal generating module 1402 may be implemented with an oscillator. The transmission of the various signals in the time-division manner by the switching module may be under the control of a system timing signal in the receiver, implement of which is apparent and description thereof is omitted.

Alternatively, as shown in FIG. 15, the correction signal injecting module 1301 may include a switching module 1501 and a correction signal converting module 1502. FIG. 15 is similar to FIG. 14, except that if the receiver and the transmitter coexist in practice, the correction signal may not be generated by the oscillator, instead, the correction signal is generated as follows: during transmitter operation, the correction signal converting module 1502 converts a fraction of the transmitted signal into the signal for correction of the branches in the receiver.

In practice, it is necessary to carry out delay correction and amplitude and phase correction; therefore, the M single-path fixed-gain branch modules 1302, the M single-path ADCs 1303, DDC module 1304S1, the M low-pass filter modules 1304S2, the amplitude and phase correction module 1307, the M-to-1 MUX control module 1309, the M-to-1 MUX module 1311 and the digital receiving path post-stage 1312 are necessary, while the other modules may be optional dependent upon the actual application. In practice, the receiver may include an upstream analog receiving path module without analog I&Q demodulation function, the function and connection relationship of which are similar to those of the corresponding module in the first embodiment of the device, except that the analog I&Q demodulation function is not included. In other words, the input to the switching module 1401 of the correction signal injecting module 1301 is from the upstream analog receiving path module without analog I&Q demodulation function and the correction signal generating module 1402 or the correction signal converting module 1502, and description thereof is omitted.

A Fourth Embodiment of the Device

Figure 16:
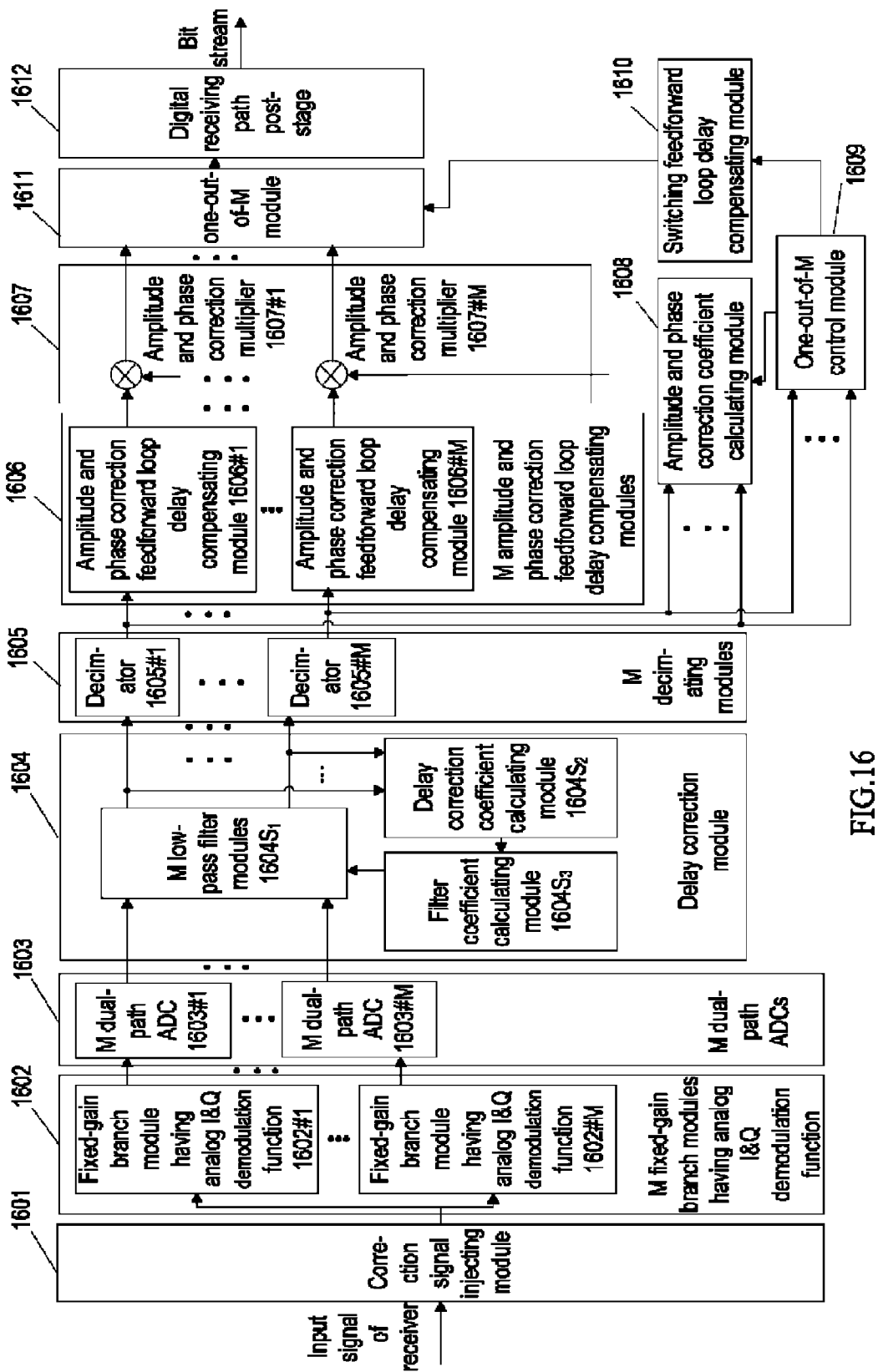
FIG. 16 is a schematic diagram showing the structure, according to a fourth embodiment of the device in the present invention.

As shown in FIG. 16, the receiver in the present embodiment includes a correction signal injecting module 1601, M fixed-gain branch modules 1602 each having a function of analog I&Q demodulation, M dual-path ADCs 1603, a delay correcting module 1604, M decimating modules 1605, M amplitude and phase correction feedforward loop delay compensating modules 1606, an amplitude and phase correction module 1607, an amplitude and phase correction coefficient calculating module 1608, a M-to-1 MUX control module 1609, a switching feedforward loop delay compensating module 1610, a M-to-1 MUX module 1611, and a digital receiving path post-stage 1612.

The present embodiment is similar to the third embodiment of the device, except that no digital I&Q demodulation component is included in the present embodiment because of the fixed-gain branch modules each having the analog I&Q demodulation function, i.e. the M fixed-gain branch modules 1602 each having the function of analog I&Q demodulation. Because no low-pass filter of the digital I&Q demodulation component is available for delay correction in the present embodiment, M low-pass filter modules 1604S1, a delay correction coefficient calculating module 1604S2 and a filter coefficient calculating module 1604S3 are included in the receiver. Similar to the third embodiment of the device, the delay correction coefficient calculating module 1604S2 and the filter coefficient calculating module 1604S3 may be optional dependent upon the application.

In practice, a direct current and I&Q error correction module may be added between the M dual-path ADCs 1603 and the delay correcting module 1604 and removes circuitry errors including direct current errors in the I and Q signals that are caused by the circuitry characteristics and amplitude and phase errors between the I and Q circuitry branches.

The other modules in the present embodiment have functions and connection relationships similar to those of the respective modules in the third embodiment of the device, and description thereof is omitted.

Accordingly, in practice, the part of the multi-branch correction preprocess module 401 that implements the I&Q demodulation, whether an offline configuration mode or an online configuration mode is used to configure initial values of amplitude and phase correction coefficients in the multi-branch correcting and switching module 402, i.e. whether an amplitude and phase correction coefficient calculating module is included, whether a parallel fixed-gain branch module or a ladder fixed-gain branch module is used, whether to decimate the signal, whether to compensate a delay during the operation of the receiver, whether to correct a delay of a signal before the amplitude and phase correction, whether an offline configuration mode or an online configuration mode is used to configure a delay correction coefficient, i.e. whether a delay correction coefficient calculating module and a filter coefficient calculating module are included, whether a direct current and I&Q error correction module is included, whether a correction signal injecting module is included, and so on, all depend on the actual design of the receiver, and various combinations of the above may be obtained according to actual applications, but device structures formed from the combinations are not described in detail herein.

With the solutions in the embodiments of the invention, the input signal of a receiver which is an analog band-pass signal may be processed as digital baseband signals which are consistent with each other in terms of time, amplitude and phase, and then one of the digital baseband signals is selected according to a switching strategy. In the invention, the time, amplitude and phase of the signals are all corrected, and therefore the switching from the current branch to another branch according to the switching strategy may be performed on a sample by sample basis. In other words, the switching time granularity is smaller than a time interval between two samples of the digital baseband signal, as a result, a signal change may be traced rapidly, thereby increasing the non-simultaneous dynamic range and improving the performance of the receiver.

Corresponding to the device provided in the invention, a wireless signal receiving method is further provided in the invention, and the method includes: after processing, by a receiver, the input signal of the receiver as M digital baseband signals, correcting amplitudes and phases of the M digital baseband signals, selecting and outputting one of the M digital baseband signals according to a switching strategy, and obtaining a bit stream through performing digital processing on the selected digital baseband signal.

Figure 17:
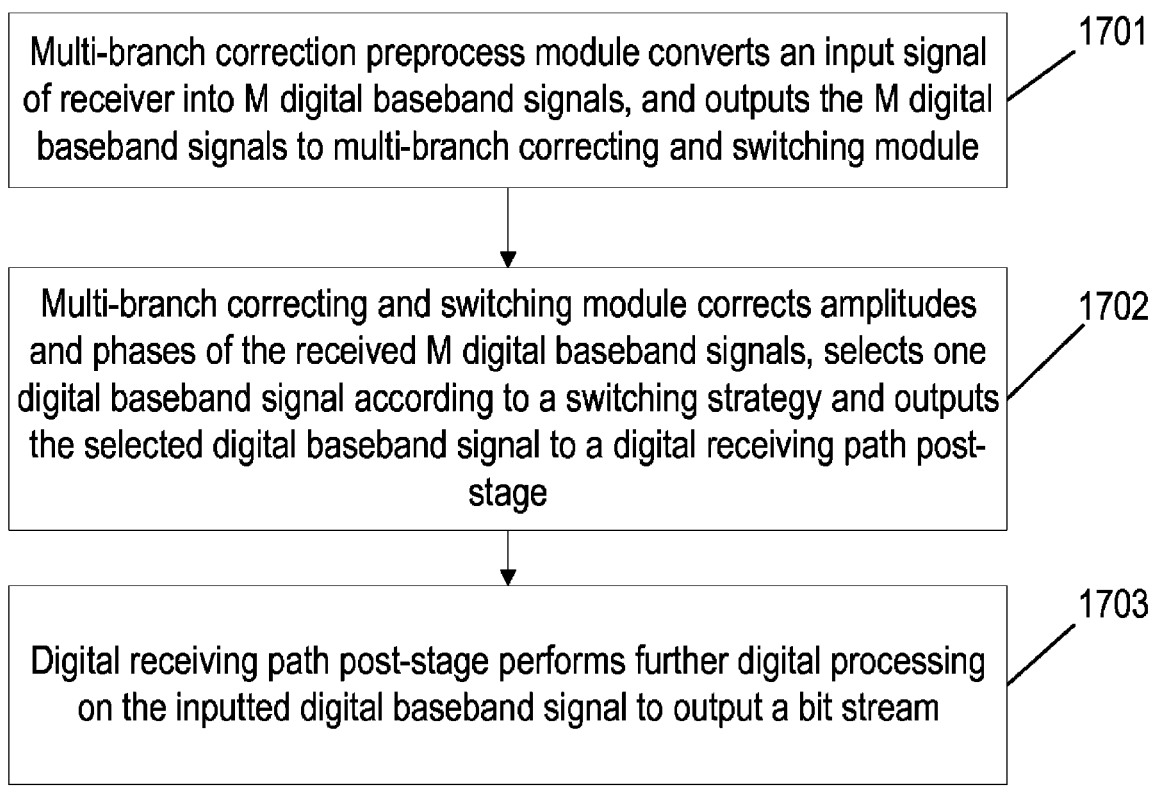
FIG. 17 is a flow chart illustrating the wireless signal receiving method, according to an embodiment of the present invention.

FIG. 17 is a flow chart illustrating the wireless signal receiving method according to an embodiment of the invention. As shown in FIG. 17, the wireless signal receiving method according to the embodiment of the invention includes the following steps.

Step 1701: A multi-branch correction preprocess module converts an input signal of a receiver into M digital baseband signals, and outputs the M digital baseband signals to the multi-branch correcting and switching module.

Generally, the multi-branch correction preprocess module may convert the receiver input signal that is an analog band-pass signal into the digital baseband signals through processing including a ladder gain processing, baseband demodulation, digital sampling, etc.

Step 1702: The multi-branch correcting and switching module corrects amplitudes and phases of the received M digital baseband signals, selects one digital baseband signal according to a switching strategy and outputs the selected digital baseband signal to a digital receiving path post-stage.

Step 1703: The digital receiving path post-stage performs further digital processing on the inputted digital baseband signal to output a bit stream.

In the embodiment of the invention, in the case where the output signal of a branch has a large amplitude but is not saturated, the circuit of the branch may be regarded as linear and may be described with a transfer function. The transfer function of each branch may be expressed as follows:

$H_i(f)=|H_i(f)|\exp(j\phi_i(f))$, where f denotes a signal frequency, $\phi$ denotes a phase, and i denotes a branch index corresponding to the branch, where $1 \leq i \leq M$.

Further, in practice, the following applies:

1) $|H_i(f)|=\rho_i|H(f)|$, $\rho_i>0$, where $\rho_i$ denotes an amplitude response value of a branch and may vary with the branch index i, but may be regarded as substantially unchanged in a short period of time.

2) $\phi_i(f)=2\pi f\tau_i+\phi_i$, where $\tau_i$ and $\phi_i$ denotes respectively a delay response value and a phase response value of the branch and may vary with the branch index i, but may be regarded as substantially unchanged in a short period of time.

3) $|H(f)|$ is flat within a system frequency band, and an in-band equalization is not necessary even $|H(f)|$ is slightly not flat.

As can be seen from the above transfer function, difference between signals obtained by subjecting the receiver input signal to the M branches depends on the M delay characteristic values $\tau_i$, the M amplitude characteristic values $\rho_i$ and the M phase characteristic values $\phi_i$, where i=1~M. However, in practice, if a delay error does not exist between branches of the receiver or is negligible, the difference between signals obtained by subjecting the receiver input signal to the M branches depends only on the M amplitude characteristic values $\rho_i$ and the M phase characteristic values $\phi_i$, therefore the amplitude and phase correction is required in the invention. In other words, if the amplitudes and phases of the M digital baseband signals obtained from the multi-branch correction preprocess module are corrected so that signals having a sufficiently large amplitude but not saturated in all the branches are consistent with each other in terms of amplitude and phase, the switching on a sample by sample basis may be achieved when a signal is selected from M signals and outputted, thereby tracing the signal change rapidly.

In embodiments of the invention, there are the following multi-branch correction preprocess methods.

(1) As shown in FIG. 5, an upstream analog receiving path module having a function of analog I&Q demodulation performs processing, such as amplification, frequency mixing, and analog I&Q demodulation on the analog band-pass signal, converts the input signal of the receiver into analog baseband signals, and outputs the analog baseband signals to the M dual-path fixed-gain branch modules. The M dual-path fixed-gain branch modules subject the analog baseband signals to M branches for ladder gain processing, and output the processed analog baseband signals to M dual-path ADCs. The M dual-path ADCs sample the analog baseband signals to obtain digital baseband signals.

(2) As shown in FIG. 6, M fixed-gain branch modules each having a function of analog I&Q demodulation subject analog band-pass signals to M branches each having the analog I&Q demodulation function, to perform ladder gain processing on the analog band-pass signals and obtain M analog baseband signals, and output the M analog baseband signals to M dual-path ADCs. The M dual-path ADCs sample the analog baseband signals to obtain digital baseband signals.

(3) As shown in FIG. 7, M single-path fixed-gain branch modules perform ladder gain processing on analog band-pass signals through M branches, and output the analog band-pass signals to M single-path ADCs. The M single-path ADCs sample the analog band-pass signals to obtain M digital band-pass signals, and output the M digital band-pass signals to a digital I&Q demodulation component. The digital I&Q demodulation component performs digital I&Q demodulation on the M digital band-pass signals to obtain digital baseband signals.

It should be noted that in the above methods (2) and (3) of the invention, the input signal of the receiver may be subjected to processing, such as amplification and frequency mixing, before the ladder gain processing.

The input signal of the receiver is an analog band-pass signal, which is a real signal. The I&Q demodulation in the receiver, which is necessary, is to convert the real signal into a complex signal. It should be noted that the term "demodulation" in the I&Q demodulation refers to a procedure in which the band-pass signal is shifted to baseband, low-pass filtering processing is performed to filter out digital mirrors and other interference signals and I&Q signals are obtained, instead of referring to recovering signal symbols in the constellation before modulation. In the case of analog I&Q demodulation, the frequency shifting and analog low-pass filtering are performed at an analog signal processing stage, and in the case of digital I&Q demodulation, the frequency shifting and digital low-pass filtering are performed at a digital signal processing stage.

For a multi-carrier receiver to which the input signal containing a plurality of carriers is inputted, it is necessary to perform further down-conversion on the received digital baseband signals after the digital receiving path post-stage module, i.e. shifting the central frequency of each carrier to 0 Hz. Subsequently, the multi-carrier receiver filters and decimates the digital baseband signals to obtain a plurality of baseband signals corresponding to the plurality of carriers, and demodulates the baseband signals to obtain a plurality of bit streams.

For a single-carrier receiver to which the input signal containing only one carrier is inputted, baseband signal of the only one carrier may be obtained after I&Q demodulation, therefore the down-conversion is not required in the digital receiving path post-stage module, instead, the baseband signal is filtered and decimated, and demodulated to obtain a bit stream.

The modulus of the digital baseband signals reflects an envelope shape of the input signal of the receiver; therefore, the digital baseband signals are also generally referred to as a complex envelope. The samples, digital baseband signals, or complex envelope described below in the invention has a uniform meaning. The samples include all samples of the digital baseband signals, and the power of a sample is the power of the complex envelope where the sample is located.

In the embodiment of the invention, in order for the multi-branch correcting and switching module to correct amplitudes and phases of the M digital baseband signals, amplitude and phase correction coefficients for the amplitude and phase correction module are configured. The amplitude and phase correction coefficients may be configured in an offline configuration mode or an online configuration mode. However, the procedure of calculating the amplitude and phase correction coefficients is similar in the offline configuration mode and the online configuration mode.

For better understanding of the embodiment of the invention, the method for calculating the amplitude and phase correction coefficients is described in detail below.

It is assumed that the receiver in the embodiment of the invention includes M branches which have gains $G_1 \sim G_M$, respectively. The first branch has the largest gain, the second branch has the second-largest gain, . . . , and the $M^{th}$ branch has the least gain. Additionally, it is assumed that the first and second branches form the first pair of adjacent branches, a gain difference of which, i.e. $G_1-G_2$, is $\Delta G_1$; the second and third branches form the second pair of adjacent branches, a gain difference of which is $\Delta G_2$; . . . ; the $(M-1)^{th}$ and $M^{th}$ branches form the $(M-1)^{th}$ adjacent branch, a gain difference of which is $\Delta G_{M-1}$.

Further, the digital baseband signals before the correction may be given as $\tilde{x}_k(n)$, $\tilde{x}_k(n)=i_k(n)+jq_k(n)$, where $i_k(n)$ and $q_k(n)$ are the numbers of fixed points in the range of $[-1,1)$. In other words, the complex envelope amplitude $|\tilde{x}_k(n)|$ satisfies $|\tilde{x}_k(n)| \leq 1$. The k means the $k^{th}$ branch and n means the $n^{th}$ sample. It is further assumed that the samples are obtained through the decimation with a decimating factor R; thus, the sample interval is $RT_S$. If the power of $\tilde{x}_k(n)$ is defined as $10 \log_{10}(|\tilde{x}_k(n)|^2)$ dBFS, the power of the complex envelope is 0 dBFS when $|\tilde{x}_k(n)|=1$.

According to the above definition, if the power of a signal sample before correction in a branch is 0 dBFS, the branch is critically saturated. However in practice, an envelope back-off $BCE_k$ is typically provided for each branch to prevent ADC saturation due to an envelope distortion. The branch may be regarded as saturated if the power of the complex envelope is larger than $-BCE_k$. Therefore, to select a branch outputting the $n^{th}$ sample through a switching strategy in the invention, it is possible to select, from all the branches where the power of the $n^{th}$ sample is smaller than or equal to $-BCE_k$ dBFS, a branch having the largest signal amplitude or the largest gain as the branch outputting the $n^{th}$ sample. If amplitude and phase correction coefficients are calculated based on samples after amplitude and phase correction; accordingly, samples after amplitude and phase correction are taken for selection. In this case, the influence of the amplitude and phase correction coefficients is removed by dividing the sample value with the amplitude and phase correction coefficients, so as to recover the sample value before amplitude and phase correction; subsequently, the same process of sample selection as samples before amplitude and phase correction is performed. The descriptions of the sample selection process in the following embodiments are based on the case of samples before amplitude and phase correction. As to the case of samples after amplitude and phase correction, except for adding the step of dividing the sample value with the amplitude and phase correction coefficients, the other processing steps are the same as those for the samples before amplitude and phase correction, so the description thereof is omitted.

In the embodiment of the invention, the method for calculating an amplitude and phase correction coefficient includes the following.

Step 1: For each pair of adjacent branches, a sample to be used for relative amplitude and phase correction calculation is selected from the inputted samples.

The same sample of the input signal processed by the multi-branch correction preprocess module 401 has a different amplitude and phase dependent upon the M branches in the embodiment of the invention. If amplitude and phase differences among the same samples from the M branches can be calculated, the amplitudes and phases for the various branches may be compensated accordingly, so that the digital baseband signals in the M compensated branches are consistent with each other in terms of amplitude and phase, thereby implementing the correction.

However, in each pair of adjacent branches, not all the samples are suitable for relative amplitude and phase correction calculation for the pair of adjacent branches. For example, if the ADC of a branch in a pair of adjacent branches is saturated at a certain sample, the output signal of the branch cannot reflect the actual gain of the branch; therefore, the sample shall not be used to calculate the relative amplitude and phase correction coefficient for the pair of adjacent branches. Therefore, in the embodiment of the invention, each pair of adjacent branches provided with an amplitude and phase correction window, which is located where the ADC is near to the full scale but is not saturated. Only signal samples within the amplitude and phase correction window are selected for the relative amplitude and phase correction calculation for the pair of adjacent branches, which is referred to as selecting of an amplitude and phase correction signal, and selecting conditions are given as follows:

$$\begin{cases} -BCE_k - W_{AP,k} \leq P_k(n) < -BCE_k \\ -BCE_k - W_{AP,k} - \Delta G_k \leq P_{k+1}(n) < -BCE_k - \Delta G_k \end{cases}$$

Where, $1 \leq k \leq M-1$, AP denotes the amplitude and phase correction, $BCE_k$ denotes an envelope back-off value for the $k^{th}$ branch, $[-BCE_k - W_{AP,k}, -BCE_k]$ denotes an amplitude and phase correction window of the higher-gain branch in the $k^{th}$ pair of adjacent branches, and $[-BCE_k - W_{AP,k} - \Delta G_k, -BCE_k - \Delta G_k]$ denotes an amplitude and phase correction window of the lower-gain branch in the $k^{th}$ pair of adjacent branches. $W_{AP,k}$ denotes a width of the amplitude and phase correction window of the $k^{th}$ pair of adjacent branches, and has a minimum close to 0 and a maximum of infinity. When $W_{AP,k}$ has a value of infinity, samples are within the amplitude and phase correction window of the $k^{th}$ pair of adjacent branches as long as the $k^{th}$ branch is not saturated. $P_k(n)$ denotes the power of the $n^{th}$ sample of the $k^{th}$ branch, $P_{k+1}(n)$ denotes the power of the $n^{th}$ sample of the $(k+1)^{th}$ branch, and $\Delta G_k$ denotes a gain difference of the $k^{th}$ pair of adjacent branches. According to the above formula, in terms of the $k^{th}$ pair of adjacent branches, the $n^{th}$ sample of the $k^{th}$ branch can be used for the relative amplitude and phase correction calculation for the $k^{th}$ pair of adjacent branches, only if the power of the $n^{th}$ sample of the $k^{th}$ branch is between $-BCE_k - W_{AP,k}$ and $-BCE_k$, and the power of the $n^{th}$ sample of the $(k+1)^{th}$ branch is between $-BCE_k - W_{AP,k} - \Delta G_k$ and $-BCE_k - \Delta G$.

In practice, a certain sample may be used for the relative amplitude and phase correction calculation for a plurality of pairs of adjacent branches if the sample is within the amplitude and phase correction windows of the plurality of pairs of adjacent branches.

Step 2: A current accumulated power of the higher-gain branch in each pair of adjacent branches is calculated using the previous accumulated power and the current sample power of the higher-gain branch. A current accumulated power of the lower-gain branch in the pair of adjacent branches is calculated using the previous accumulated power and the current sample power of the lower-gain branch. A current accumulated cross correlation for the pair of adjacent branches is calculated using the previous accumulated cross correlation and the current sample cross correlation value of the pair of adjacent branches.

Let $n_{AP}(l_{AP,k})$ denote the index of the sample used for the current amplitude and phase correction coefficient calculation for the $k^{th}$ pair of adjacent branches. In other words, the nth sample is within the amplitude and phase correction window of the $k^{th}$ pair of adjacent branches; furthermore, the $n^{th}$ sample is within the amplitude and phase correction window of the $k^{th}$ pair of adjacent branches at the $l_{AP,k}$ time. Let $P_{k,H}(l_{AP,k})$ and $P_{k,H}(l_{AP,k}-1)$ denote the $l_{AP,k}^{th}$ accumulated power and the $(l_{AP,k}-1)^{th}$ accumulated power of the higher-gain branch in the pair of adjacent branches, respectively, i.e. the current accumulated power of the higher-gain branch and the previous accumulated power of the higher-gain branch, let $P_{k,L}(l_{AP,k})$ and $P_{k,L}(l_{AP,k}-1)$ denote the $l_{AP,k}^{th}$ accumulated power and the $(l_{AP,k}-1)^{th}$ accumulated power of the lower-gain branch in the pair of adjacent branches, respectively, i.e. the current accumulated power and the previous accumulated power of the lower-gain branch, and let $R_{AP,k}(l_{AP,k})$ and $R_k(l_{AP,k}-1)$ denote the $l_{AP,k}^{th}$ accumulated cross correlation and the $(l_{AP,k}-1)^{th}$ accumulated cross correlation for the pair of adjacent branches, respectively, i.e. the current sample accumulated cross correlation and the previous accumulated cross correlation for the pair of adjacent branches.

Initial values of the accumulated power of the higher-gain branch, the accumulated power of the lower-gain branch and the accumulated cross correlation for the pair of adjacent branches are set to 0. In other words, the values of $P_{k,H}(0)$, $P_{k,L}(0)$ and $R_{AP,k}(0)$ are 0 upon power-on or reset.

The current accumulated power of the higher-gain branch, the current accumulated power of the lower-gain branch and the current accumulated cross correlation for the pair of adjacent branches may be given as follows:

$$P_{k,H}(l_{AP,k}) = (1 - \alpha_{AP,k}(l_{AP,k}))|\tilde{x}_k(n_{AP}(l_{AP,k}))|^2 + \alpha_{AP,k}(l_{AP,k})P_{k,H}(l_{AP,k}-1)$$

$$P_{k,L}(l_{AP,k}) = (1 - \alpha_{AP,k}(l_{AP,k}))|\tilde{x}_{k+1}(n_{AP}(l_{AP,k}))|^2 + \alpha_{AP,k}(l_{AP,k})P_{k,L}(l_{AP,k}-1)$$

$$R_{AP,k}(l_{AP,k}) = (1 - \alpha_{AP,k}(l_{AP,k}))\tilde{x}_k(n_{AP}(l_{AP,k}))\tilde{x}^*_{k+1}(n_{AP}(l_{AP,k})) + \alpha_{AP,k}(l_{AP,k})R_{AP,k}(l_{AP,k}-1)$$

Where, $\alpha_{AP,k}(l_{AP,k})$ denotes the previous-value weight of the $\alpha$ filter of $k^{th}$ pair of adjacent branches, and is referred to as an $\alpha$ factor for short. $\tilde{x}_k(n_{AP}(l_{AP,k}))$ denotes a signal value of the $n_{AP}(l_{AP,k})^{th}$ sample of the $k^{th}$ branch, i.e. the higher-gain branch of the $k^{th}$ pair of adjacent branches, $\tilde{x}_{k+1}(n_{AP}(l_{AP,k}))$ denotes a signal value of the $n_{AP}(l_{AP,k})^{th}$ sample of the $(k+1)^{th}$ branch, i.e. the lower-gain branch of the kth pair of adjacent branches, $\tilde{x}^*_{k+1}(n_{AP}(l_{AP,k}))$ denotes the conjugate of the $\tilde{x}_{k+1}(n_{AP}(l_{AP,k}))$, $|\tilde{x}_k(n_{AP}(l_{AP,k}))|^2$ denotes the current sample power of the higher-gain branch, $|\tilde{x}_{k+1}(n_{AP}(l_{AP,k}))|^2$ denotes the current sample power of the lower-gain branch, and $\tilde{x}_k(n_{AP}(l_{AP,k}))\tilde{x}^*_{k+1}(n_{AP}(l_{AP,k}))$ denotes the current cross correlation value of the pair of adjacent branches. The value of $\alpha_{AP,k}(l_{AP,k})$ depends on the circuitry characteristics of the kth pair of adjacent branches, $\alpha_{AP,k}(l_{AP,k})$ is approximately 1 in a time period when the circuitry characteristics remains substantially unchanged in order to achieve an effect of correlation accumulation, and is approximately 0 in a time period when the circuitry characteristics changes remarkably, in order to remove the influence of the previous circuitry characteristics on the current calculated value.

In practice, it is suggested that $\alpha_{AP,k}(l_{AP,k}) = (\theta_{AP,k})^{((n_{AP}(l_{AP,k}) - n_{AP}(l_{AP,k}-1))RT_S)}$, where $\theta_{AP,k}$ depends on the circuitry characteristics of the $k^{th}$ pair of adjacent branches, and $RT_S$ denotes a value of a time difference between samples and is typically very small and close to 0. According to the formula $\alpha_{AP,k}(l_{AP,k}) = (\theta_{AP,k})^{((n_{AP}(l_{AP,k}) - n_{AP}(l_{AP,k}-1))RT_S)}$, if the circuitry characteristics of the $k^{th}$ pair of adjacent branches is substantially unchanged, a time interval between samples which fall in the amplitude and phase correction window of the $k^{th}$ pair of adjacent branches at two successive times is not large, that is, the value of $(n_{AP}(l_{AP,k})-n_{AP}(l_{AP,k}-1))RT_S$ is still very small, the $(\theta_{AP,k})^\wedge((n_{AP}(l_{AP,k})-n_{AP}(l_{AP,k}-1))RT_S)$ is smaller than 1 but is very close to 1. However, if the circuitry characteristics of the kth pair of adjacent branches changes remarkably, a time interval between samples which fall in the amplitude and phase correction window of the $k^{th}$ pair of adjacent branches at two successive times is large, that is, the value of $(n_{AP}(l_{AP,k})-n_{AP}(l_{AP,k}-1))RT_S$ is large, the $(\theta_{AP,k})^\wedge((n_{AP}(l_{AP,k})-n_{AP}(l_{AP,k}-1))RT_S)$ is a positive value close to 0.

In practice, it is rather complicated to apply directly $\alpha_{AP,k}(l_{AP,k})$ to the $\alpha$ filter for calculating, therefore a lookup table including conversion from $n(l_{AP,k})-n(l_{AP,k}-1)$ to $(\theta_{AP,k})^\wedge((n_{AP}(l_{AP,k})-n_{AP}(l_{AP,k}-1))RT_S)$ may be generated. The value of $n_{AP}(l_{AP,k})-n_{AP}(l_{AP,k}-1)$ can be obtained from a counter by increasing the counter by 1 every $RT_S$. To calculate a new accumulated power, the value of $(\theta_{AP,k})^\wedge((n_{AP}(l_{AP,k})-n_{AP}(l_{AP,k}-1))RT_S)$ may be obtained directly from the lookup table according to the value of $n_{AP}(l_{AP,k})-n_{AP}(l_{AP,k}-1)$ recorded by the counter and used directly in calculating the new accumulated power, and subsequently the counter is reset to zero.

In practice, it is noted that if the kth pair of adjacent branches may ensure that sufficient samples of an amplitude and phase correction signal are available in a time period when the circuitry amplitude and phase characteristic is substantially unchanged, the $\alpha_{AP,k}(l_{AP,k})$ may be set in advance as a value smaller than 1 but close to 1, thereby reducing the amount of calculation.

Step 3: A relative amplitude and phase correction coefficient of the pair of adjacent branches is calculated using the current accumulated power of the higher-gain branch in the pair of adjacent branches, the current accumulated power of the lower-gain branch in the pair of adjacent branches and the current correlation accumulation value of the pair of adjacent branches.

The relative amplitude and phase correction coefficient of the pair of adjacent branches may be given by the following formula:

$$r_{AP,k}(l_{AP,k}) = a_k(l_{AP,k})\exp(jb_k(l_{AP,k})) = \left(\frac{P_{k,L}(l_{AP,k})}{P_{k,H}(l_{AP,k})}\right)^{1/2} \frac{R^*_{AP,k}(l_{AP,k})}{|R_{AP,k}(l_{AP,k})|}$$

Where, $r_{AP,k}(l_{AP,k})$ denotes the relative amplitude and phase correction coefficient of the $k^{th}$ pair of adjacent branches, $a_k(l_{AP,k})$ denotes an amplitude different between the $k^{th}$ pair of adjacent branches, and $b_k(l_{AP,k})$ denotes a phase different between the $k^{th}$ pair of adjacent branches. According to the calculation formulas of $P_{k,H}(l_{AP,k})$, $P_{k,L}(l_{AP,k})$ and $R_{AP,k}(l_{AP,k})$, $$\frac{P_{k,H}(l_{AP,k})}{P_{k,L}(l_{AP,k})}$$

denotes a ratio of the power of the higher-gain branch in the $k^{th}$ pair of adjacent branches to that of the lower-gain branch in the $k^{th}$ pair of adjacent branches, and the phase of $R_{AP,k}(l_{AP,k})$ denotes an amount by which the phase of the higher-gain branch in the $k^{th}$ pair of adjacent branches advances that of the lower-gain branch in the $k^{th}$ pair of adjacent branches. The amplitude of the output signal of the higher-gain branch is the same as that of the lower-gain branch after the signal of the higher-gain branch is multiplied by $$\left(\frac{P_{k,L}(l_{AP,k})}{P_{k,H}(l_{AP,k})}\right)^{1/2},$$

because a ratio of power is a square of a ratio of amplitude. The phase of the output signal of the higher-gain branch is the same as that of the lower-gain branch after the signal of the higher-gain branch is multiplied by $$\frac{R^*_{AP,k}(l_{AP,k})}{|R_{AP,k}(l_{AP,k})|}.$$

Therefore, according to $$a_k(l_{AP,k}) = \left(\frac{P_{k,L}(l_{AP,k})}{P_{k,H}(l_{AP,k})}\right)^{1/2},$$

the amplitude difference between the $k^{th}$ pair of adjacent branches may be calculated using the accumulated power of the higher-gain branch and the lower-gain branch. Furthermore, according to $$\exp(jb_k(l_{AP,k})) = \frac{R^*_{AP,k}(l_{AP,k})}{|R_{AP,k}(l_{AP,k})|},$$

the phase difference between the $k^{th}$ pair of adjacent branches may be calculated using the accumulated cross correlation power and the conjugate thereof.

Step 4: All the amplitude and phase correlation coefficients are obtained according to the relative amplitude and phase correction coefficients of all the pairs of adjacent branches.

To calculate all the amplitude and phase correlation coefficients, a certain branch is designated in advance as a reference branch. The reference branch is fixed after the designation, and is used in each calculation of all the amplitude and phase correlation coefficients. In each calculation of all the amplitude and phase correlation coefficients, the amplitude and phase correlation coefficient of the reference branch is 1 and maintained unchanged. Amplitude and phase correlation coefficients of the other branches are recalculated with reference to the reference branch.

It is assumed that the APREF$^{th}$ branch is set as the reference branch, where, $1 \leq APREF \leq M$, all the amplitude and phase correlation coefficients may be calculated with the following formulas:

$$c_{AP,k} = \prod_{i=k}^{APREF-1} r_{AP,i}, k = 1 \sim APREF-1$$

$$c_{AP,APREF} = 1$$

$$c_{AP,k} = \prod_{i=APREF}^{k-1} \frac{1}{r_{AP,i}}, k = APREF+1 \sim M$$

Where, $r_{AP,i}$ denotes a relative amplitude and phase correlation coefficient of the ith pair of adjacent branches, where, $1 \leq i \leq M-1$. If $k \leq APREF-1$, the amplitude and phase correlation coefficient of the kth branch is a product of the relative amplitude and phase correlation coefficients of the kth to (APREF-1)th pairs of adjacent branches, i.e.

$$c_{AP,k} = \prod_{i=k}^{APREF-1} r_{AP,i}.$$

If k=APREF, the amplitude and phase correlation coefficient of the kth branch is 1, i.e. $c_{AP,APREF}=1$. If k≧APREF-1, the amplitude and phase correlation coefficient of the kth branch is the reciprocal of the product of the relative amplitude and phase correlation coefficients of the APREFth to (k-1)th pairs of adjacent branches, i.e.

$$c_{AP,k} = \prod_{i=APREF}^{k-1} \frac{1}{r_{AP,i}}.$$

In other words, if the APREFth branch is the reference branch, only the signal of the APREFth branch is not changed by the amplitude and phase correction, but the signals of all the other branches after the amplitude and phase correction are changed and become consistent to that of the reference branch.

In practice, when a certain sample is within the amplitude and phase correction windows of a plurality of pairs of adjacent branches, it is possible to calculate firstly the relative amplitude and phase correction coefficient only, and all the amplitude and phase correction coefficients are calculated finally after all the cases where a sample is within amplitude and phase correction windows of a plurality of pairs of adjacent branches are dealt with. For example, when the nth sample is within the amplitude and phase correction windows of the second and third pairs of adjacent branches, respectively; firstly, Steps 2 and 3 are carried out according to the second pair of adjacent branches; subsequently, Steps 2 and 3 are carried out according to the third pair of adjacent branches; and finally, all the amplitude and phase correction coefficients are calculated, to obtained the amplitude and phase correction coefficients $c_{AP,k}$ of all the branches.

In practice, a delay error may exist between the ladder-gain branches of a receiver. The digital baseband signal needs to be subjected to delay correction before amplitude and phase correction if the delay error exceeds a threshold.

In an embodiment of the invention, the calculation of a filter coefficient is essential to the delay correction. The method for calculating the filter coefficient includes the following.

Step 1: For a pair of adjacent branches, a sample for the calculation of the delay correction is selected from samples of the digital baseband signal.

Unlike the calculation of the amplitude and phase correction coefficient, typically, samples before decimation, which have a sample interval of $T_S$, are used for calculation of the delay correction to improve the precision of the delay correction.

Similar to the calculation of the amplitude and phase correction coefficient, not all the samples are suitable for the calculation of the delay correction coefficient. The signal is saturated and distorted if the gain is too large, and affected by noise if the gain is too small. In other words, the correction precision is lowered if the gain is either too large or too small. Likewise, a delay correction window is provided for each pair of adjacent branches in the present invention, and it is assumed that only samples within the delay correction window may be selected for the calculation of the relative delay correction for the pair of adjacent branches. For each pair of adjacent branches, only inputted signal samples satisfying selection conditions can be used for the delay correction calculation. The selection conditions may be given by the following formulas:

$$\begin{cases} -BCE_k - W_{T,k} \le P_k(n) < -BCE_k \\ -BCE_k - W_{T,k} \le P_k(n-1) < -BCE_k \\ \ldots \\ -BCE_k - W_{T,k} \le P_k(n-L) < -BCE_k \\ -BCE_k - W_{T,k} - \Delta G_k \le P_{k+1}(n) < -BCE_k - \Delta G_k \\ -BCE_k - W_{T,k} - \Delta G_k \le P_{k+1}(n-1) < -BCE_k - \Delta G_k \\ \ldots \\ -BCE_k - W_{T,k} - \Delta G_k \le P_{k+1}(n-L) < -BCE_k - \Delta G_k \end{cases}$$

Where, $1 \le k \le M-1$, $BCE_k$ denotes an envelope back-off value of the kth pair of adjacent branches, $[-BCE_k-W_{T,k}, -BCE_k)$ denotes a delay correction window of the higher-gain branch in the kth pair of adjacent branches and $[-BCE_k-W_{T,k}-\Delta G_k, -BCE_k-\Delta G_k)$ denotes a delay correction window of the lower-gain branch in the kth pair of adjacent branches. $W_{T,k}$ denotes a width of the delay correction window of the kth pair of adjacent branches, and has a minimum close to 0 and a maximum of infinity. When $W_{T,k}$ has a value of infinity, a sample is within the delay correction window of the kth pair of adjacent branches as long as the kth branch is not saturated. $P_k(n)$ denotes the power of the nth sample of the kth branch, $P_k(n-1)$ denotes the power of the (n-1)th sample of the kth branch, and so on. Likewise, $P_{k+1}(n)$ denotes the power of the nth sample of the (k+1) th branch, $P_{k+1}(n-1)$ denotes the power of the (n-1)th sample of the (k+1)th branch, and so on. In other words, only if the nth to (n-L)th samples of the kth branch are within the delay correction window of the higher-gain branch of the kth pair of adjacent branches, and the nth to (n-L)th samples of the (k+1)th branch are also within the delay correction window of the lower-gain branch of the kth pair of adjacent branches, the total 2L+2 samples are used for calculating the delay correction coefficient for the kth pair of adjacent branches.

In practice, the delay correction window may be set in another manner, as long as a sample applicable to the delay correction calculation can be selected. For example, the delay correction window may also be given as follows:

$$\begin{cases} -BCE_k - W_{T,k} \le P_k(n) < -BCE_k \\ -BCE_k - W_{T,k} - \Delta G_k \le P_{k+1}(n-L) < -BCE_k - \Delta G_k \\ -BCE_k - W_{T,k} - \Delta G_k \le P_{k+1}(n-L+1) < -BCE_k - \Delta G_k \\ \ldots \\ -BCE_k - W_{T,k} - \Delta G_k \le P_{k+1}(n) < -BCE_k - \Delta G_k \\ -BCE_k - W_{T,k} - \Delta G_k \le P_{k+1}(n+1) < -BCE_k - \Delta G_k \\ \ldots \\ -BCE_k - W_{T,k} - \Delta G_k \le P_{k+1}(n-L) < -BCE_k - \Delta G_k \end{cases}$$

Therefore, only if the nth sample of the kth branch are within the delay correction window of the higher-gain branch of the kth pair of adjacent branches, and the (n-L)th to (n+L) th samples of the (k+1)th branch are within the delay correction window of the lower-gain branch of the kth pair of adjacent branches, the total 2L+2 samples may be used for calculating the delay correction. It is noted that method for the calculation of the correlation power between the various samples of the pair of adjacent branches may vary with the sample selecting method, and the principles of the calculation methods are similar.

Step 2: The current accumulated delay cross correlation for the pair of adjacent branches is calculated using the previous accumulated delay cross correlation and the current delay cross correlation value of the pair of adjacent branches.

A total of 2L+2 samples, including L+1 samples from the kth branch and L+1 samples from the (k+1)th branch, are selected at Step 1. Accordingly, 2L+1 different accumulated cross correlations are obtained from the cross correlation calculation on the L+1 samples from the kth branch and the respective L+1 samples from the (k+1)th branch.

Initial values of all the 2L+1 cross correlation accumulation values for the kth pair of adjacent branches, i.e. values upon power-on or reset, are set to 0. Therefore the following formula is given:

$$R_{T,k}(0,-L) = \ldots = R_{T,k}(0,-1) = R_{T,k}(0,0) =$$
$$R_{T,k}(0,1) = \ldots = R_{T,k}(0,L) = 0$$

The calculation of the 2L+1 accumulated cross correlations for the pair of adjacent branches may be calculated with the following formula:

$$R_{T,k}(l_{T,k}, d) = (1 - \alpha_{T,k}(l_{T,k})) \rho_{T,k}(l_{T,k}, d) + \alpha_{T,k}(l_{T,k}) R_{T,k}(l_{T,k}-1, d)$$

$$d = -L, -L+1, \ldots, -1, 0, 1, \ldots, L-1, L$$

Where, T denotes the delay correction, d denotes a delay difference, $l_{T,k}$ denotes the number of the cross correlation calculation for the kth pair of adjacent branches, $R_{T,k}(l_{T,k}, d)$ denotes the $l_{T,k}^{th}$ or current cross correlation value for the delay d between the $k^{th}$ pair of adjacent branches, $R_{T,k}(l_{T,k}-1, d)$ denotes the $(l_{T,k}-1)^{th}$ or previous cross correlation value for the delay d between the pair of adjacent branches, $\rho_{T,k}(l_{T,k}, d)$ denotes the current cross correlation value for the pair of adjacent branches, and $\alpha_{T,k}(l_{T,k})$ denotes an α filter previous-value weight of the kth pair of adjacent branches and is referred to as an α factor for short, which has similar meaning to that for the amplitude and phase correction coefficient calculation and can be processed similarly, and description thereof is omitted. According to the above formula, a weighted average of the previous accumulated cross correlation and the current cross correlation value of the pair of adjacent branches is the current accumulated cross correlation for the pair of adjacent branches.

Where, the current cross correlation value of the pair of adjacent branches may be given as follows:

$$\rho_{T,k}(l_{T,k}, d) = \begin{cases} \tilde{x}_k(n_T(l_{T,k}) + d)\tilde{x}^*_{k+1}(n_T(l_{T,k})) & d = -L, \ldots, -2, -1 \\ \tilde{x}_k(n_T(l_{T,k}))\tilde{x}^*_{k+1}(n_T(l_{T,k}) - d) & d = 0, 1, \ldots, L-1, L \end{cases}$$

Where, $n_T(l_{T,k})$ denotes an index of a sample used in the current adjacent delay correction coefficient calculation. If d=−L, ..., −2, −1, $\tilde{x}_k(n_T(l_{T,k})+d)\tilde{x}^*_{k+1}(n_T(l_{T,k}))$ denotes a cross correlation value between the $(n+d)^{th}$ sample from the $k^{th}$ branch and the $n^{th}$ sample from the (k+1) branch. If d=0, 1, ..., L−1, L, $\tilde{x}_k(n_T(l_{T,k}))\tilde{x}^*_{k+1}(n_T(l_{T,k})-d)$ denotes a cross correlation value between the $n^{th}$ sample from the $k^{th}$ branch and the $(n-d)^{th}$ sample from the (k+1) branch.

In practice, the current cross correlation value of the pair of adjacent branches may be alternatively given as follows:

$$\rho_{T,k}(l_{T,k}, d) =$$
$$\begin{cases} \frac{1}{L+1+d} \sum_{i=0}^{L+d} \tilde{x}_k(n(l_{T,k}) - i + d)\tilde{x}^*_{k+1}(n(l_{T,k}) - i), & d = -L, \ldots, -2, -1 \\ \frac{1}{L+1-d} \sum_{i=0}^{L-d} \tilde{x}_k(n(l_{T,k}) - i)\tilde{x}^*_{k+1}(n(l_{T,k}) - i - d), & d = 0, 1, \ldots, L-1, L \end{cases}$$

The method of calculating the current cross correlation power for the pair of adjacent branches is similar to the previous method, except that the precision is improved while the complexity is increased, because the cross correlation calculation is performed between a sample from the $k^{th}$ branch and a sample from the $(k+1)^{th}$ branch in the previous method, but in the latter method, the cross correlation calculation is performed between a plurality of samples from the $k^{th}$ branch and a plurality of samples from the $(k+1)^{th}$ branch, and an average of the calculated values is taken as the cross correlation value of the pair of adjacent branches. For example, if d=−L+2 and L≧2, the current cross correlation value may be given by $$\frac{1}{3} \sum_{i=0}^{2} \tilde{x}_k(n(l_{T,k}) - i - L + 2)\tilde{x}^*_{k+1}(n(l_{T,k}) - i).$$

In other words, the $(n-L+2)^{th}$, $(n-L+1)^{th}$ and $(n-L)^{th}$ samples from the $k^{th}$ branch are multiplied by complex conjugate of the $n^{th}$, $(n-1)^{th}$ and $(n-2)^{th}$ samples from the (k+1) branch, respectively, and the average of the three products is the current cross correlation value of the pair of adjacent branches at a delay of −L+2.

In practices, a further method of calculating the cross correlation value between the pair of adjacent branches is possible, as long as the relationship of cross correlation between the pair of adjacent branches is expressed, and description thereof is omitted.

Step 3: A current delay residual error between the pair of adjacent branches is obtained, according to the current accumulated delay cross correlation for the pair of adjacent branches.

The delay residual error between the $k^{th}$ pair of adjacent branches refers to the time by which a signal of the $k^{th}$ branch lags a signal of the $(k+1)^{th}$ branch. The delay residual error $\tau_k$ between the $k^{th}$ pair of adjacent branches is given by the following formula:

$$\tau_k = \text{Re}\left\{ \frac{\sum_{d=-L}^{L} d R_{T,k}(l_{T,k}, d)}{\sum_{d=-L}^{L} R_{T,k}(l_{T,k}, d)} \right\}$$

Where, $R_{T,k}(l_{T,k}, d)$ denotes the $l_{T,k}^{th}$ cross correlation value, i.e. the current cross correlation value, for a delay d with respect to the kth pair of adjacent branches, and Re{ } indicates an operation to obtain a real part. For example, four samples corresponding to four points of time are selected for each of the higher-gain branch and the lower-gain branch from a pair of adjacent branches, and samples from the higher-gain and lower-gain branches which have the same index correspond to the same point of time. If values obtained from the cross correlation value on samples of the pair of adjacent branches other than a value obtained from the cross correlation value for a delay of 2 between the pair of adjacent branches is 0, then $$\tau_k = \text{Re}\left\{ \frac{2 R_{T,k}(l_{T,k}, 2)}{R_{T,k}(l_{T,k}, 2)} \right\} = 2.$$

In other words, the third sample of the higher-gain branch is most correlative with the first sample of the lower-gain branch, and it is most likely that the third sample of the higher-gain branch and the first sample of the lower-gain branch are the same sample before split to the higher-gain and lower-gain branches. The signal of the higher-gain branch lags that of the lower-gain branch by a delay of 2 due to the delay difference between the pair of adjacent branches. $\tau_k$ may happen to be an integer. However, in most cases, $\tau_k$ may be a positive value or a negative value other than an integer.

Step 4: The current relative delay correction coefficient between the pair of adjacent branches is determined, according to the current delay residual error and the previous relative delay correction coefficient for the pair of adjacent branches.

The delay residual error $\tau_k$ is actually the current relative delay correction coefficient between the pair of adjacent branches. The $(l_{T,k}-1)$th or previous relative delay correction coefficient between the pair of adjacent branches is obtained after several times of delay correction calculation. By adding the current relative delay residual error between the pair of adjacent branches to the previous relative delay correction coefficient between the pair of adjacent branches, the current relative delay correction coefficient for the pair of adjacent branches can be obtained. The current relative delay correction coefficient $r_{T,k}(n_T)$ for the pair of adjacent branches may be given by the following formula:

$$r_{T,k}(n_T) = r_{T,k}(n_T - 1) - \tau_k$$

Where, $r_{T,k}(n_T-1)$ denotes the previous relative delay correction coefficient for the kth pair of adjacent branches, and $r_{T,k}(n_T)$ denotes the current relative delay correction coefficient for the kth pair of adjacent branches. According to the above formula, if the output signal of the kth branch lags that of the (k+1)th branch by $\tau_k$ samples when the kth branch is already delayed by $r_{T,k}(n_T-1)$ samples, the signal of the kth branch can be aligned with that of the (k+1)th branch only if the delay of the kth branch is adjusted as $r_{T,k}(n_T-1)-\tau_k$ samples. It is noted that $n_T$ here is different from $n_T(l_{T,k})$ in other formulas, actually, $n_T$ denotes the times for which the relative delay correction coefficient is updated, while $n_T(l_{T,k})$ denotes a sample index corresponding to $l_{T,k}$.

According to the analysis at Step 4, the signal of the kth branch can be aligned with that of the (k+1)th branch if the signal of the kth branch is delayed by $r_{T,k}(n_T)$ samples while the signal of the (k+1)th branch is delayed by 0 samples, i.e. not delayed, in consideration of only the delay relationship between the kth branch and the (k+1)th branch. In practice, $r_{T,k}(n_T)$ may happen to be an integer. However, in most cases, $r_{T,k}(n_T)$ may be a positive value, a negative value other than an integer.

Step 5: All the delay correction coefficients are obtained, according to the current relative delay correction coefficient between the pair of adjacent branches.

After a new relative delay correction coefficient is calculated for a pair of adjacent branches, to align temporally signals of M branches, a reference branch and a delay target value $\tau_{normal}$ are set in advance, and delay correction coefficients of the M branches, i.e. all the delay correction coefficients, are recalculated with reference to the reference branch. The delay target value means a group delay requirement on a low-pass filter for the delay correction.

It is assumed that the TREFth branch is assigned as the reference branch and a group delay of the reference branch is set as $\tau_{normal}$, in this case, a delay correction coefficient of the reference branch is always maintained as 0, while the other branches approach to the reference branch. The M delay correction coefficients may be given as follows:

$$c_{T,k} = \sum_{i=k}^{TREF-1} r_{T,i}, k = 1 \sim TREF-1$$

$$c_{TREF} = 0$$

$$c_{T,k} = -\sum_{i=TREF}^{k-1} r_{T,i}, k = TREF+1 \sim M$$

It is noted that the k here means the $k^{th}$ branch, instead of the $k^{th}$ pair of adjacent branches. If k=1~TREF−1, the delay correction coefficient for the $k^{th}$ branch is a sum of the relative delay correction coefficients from the $k^{th}$ pair of adjacent branches to the (TREF−1)th pair of adjacent branches. For example, a receiver is provided with five branches, the third branch is assigned as the reference branch, i.e. TREF=3, and the first and second branches form the first pair of adjacent branch, and so on. If the relative delay correction coefficient for the first pair of adjacent branches is 0.1 and the relative delay correction coefficient for the second pair of adjacent branches is 0.2, the delay correction coefficient of the first branch with respect to the reference branch is 0.3, and the delay correction coefficient of the second branch with respect to the reference branch is 0.2. It is of a similar case if k=TREF+1~M, and description thereof is omitted.

Step 6: All filter coefficients are obtained, according to all the delay correction coefficients and the delay target value.

According to Step 5, the group delay of the low-pass filter of the reference branch is set as $\tau_{normal}$. To align temporally signals of the M branches, the group delay corresponding to the filter coefficient of the kth branch is set as $\tau_{normal}+c_{T,k}$, where k=1~M, and subsequently the filter coefficients are configured for the M low-pass filters.

In practice, if the delay residual error between a pair of adjacent branches is very small or does not exceed a delay threshold value set in advance, the delay correction coefficient may not be calculated. Even in the case where the delay correction coefficient needs to be calculated, the delay correction coefficient may be calculated periodically or aperiodically and the delay correction needs not be performed frequently, as long as the system performance is not affected although the signals of the pair of adjacent branches are not fully aligned temporally.

After the input signal of the receiver is subjected to the amplitude and phase correction, a branch needs to be selected according to a switching strategy to output a signal. In practice, a M-to-1 MUX control module selects a branch according to the switching strategy to output a digital baseband signal using various methods, for example, one of which is implemented as follows.

Step X1: The M-to-1 MUX control module determines a branch having the largest gain but not saturated from the digital baseband signals before correction as a candidate selected branch.

In the case of an envelope back-off, the M-to-1 MUX control module determines whether a branch is saturated according to whether the complex envelope power reaches $-BCE_k$ dBFS, instead of 0 dBFS. If the complex envelope power reaches $-BCE_k$ dBFS, the branch is determined as saturated; otherwise, the branch is determined as not saturated.

Step X2: The M-to-1 MUX control module determines whether the previous sample is outputted from a lower-gain branch adjacent to the candidate selected branch, and whether the power of the current sample in the candidate selected branch is no lower than the hysteresis low threshold. If the previous sample is outputted from the lower-gain branch adjacent to the candidate selected branch and the power of the current sample in the candidate selected branch is no lower than the hysteresis low threshold, the lower-gain branch adjacent to the candidate selected branch is selected as the selected branch outputting the current sample; otherwise, the candidate selected branch is determines as the selected branch outputting the current sample.

In the switching between adjacent branches, if only one threshold of $-BCE_k$ dBFS is set, frequent switching may occur between the two adjacent branches because the signal of the candidate selected branch may fluctuate slightly about $-BCE_k$ dBFS, resulting in discontinuation and impact on demodulation performance. Therefore, a higher threshold and a lower threshold, i.e. a switching hysteresis, are set in the invention. In other words, $-BCE_k$ dBFS is set as a hysteresis higher threshold and $-(BCE_k+HYSAB_k)$ dBFS is set as a hysteresis lower threshold. After it is determined that the kth branch has the largest output but is not saturated, if the previous sample is outputted from the (k+1)th branch, the (k+1)th branch is maintained as the branch outputting the current sample when the power of the current sample in the kth branch is not lower than $-(BCE_k+HYSAB_k)$ dBFS; otherwise, the branch outputting the current sample is switched from the $(k+1)^{th}$ branch to the $k^{th}$ branch.

A First Embodiment of the Method

FIG. 11 is a schematic diagram showing the essential structure of a receiver in the embodiment. As shown in FIG. 11, an amplitude and phase correction coefficient is configured in the offline configuration mode. In other words, initial values of the amplitude and phase correction coefficients for the M branches are calculated and configured for the amplitude and phase correction module 1104 before the operation of the receiver, and are not changed during the operation of the receiver. The amplitude and phase correction coefficients may be configured for the receiver before the receiver is powered on, and in this case the configured amplitude and phase correction coefficients are not lost even the receiver is powered off or reset. Alternatively, the amplitude and phase correction coefficients are written once for all into the receiver after each reset of the receiver and not lost if the receiver is not powered off or reset. However in this case, the amplitude and phase correction coefficients are lost if the receiver is powered off or reset; therefore, the operation of writing all the amplitude and phase correction coefficients into the receiver needs to be carried out once after each power-on or reset of the receiver.

Figure 18:
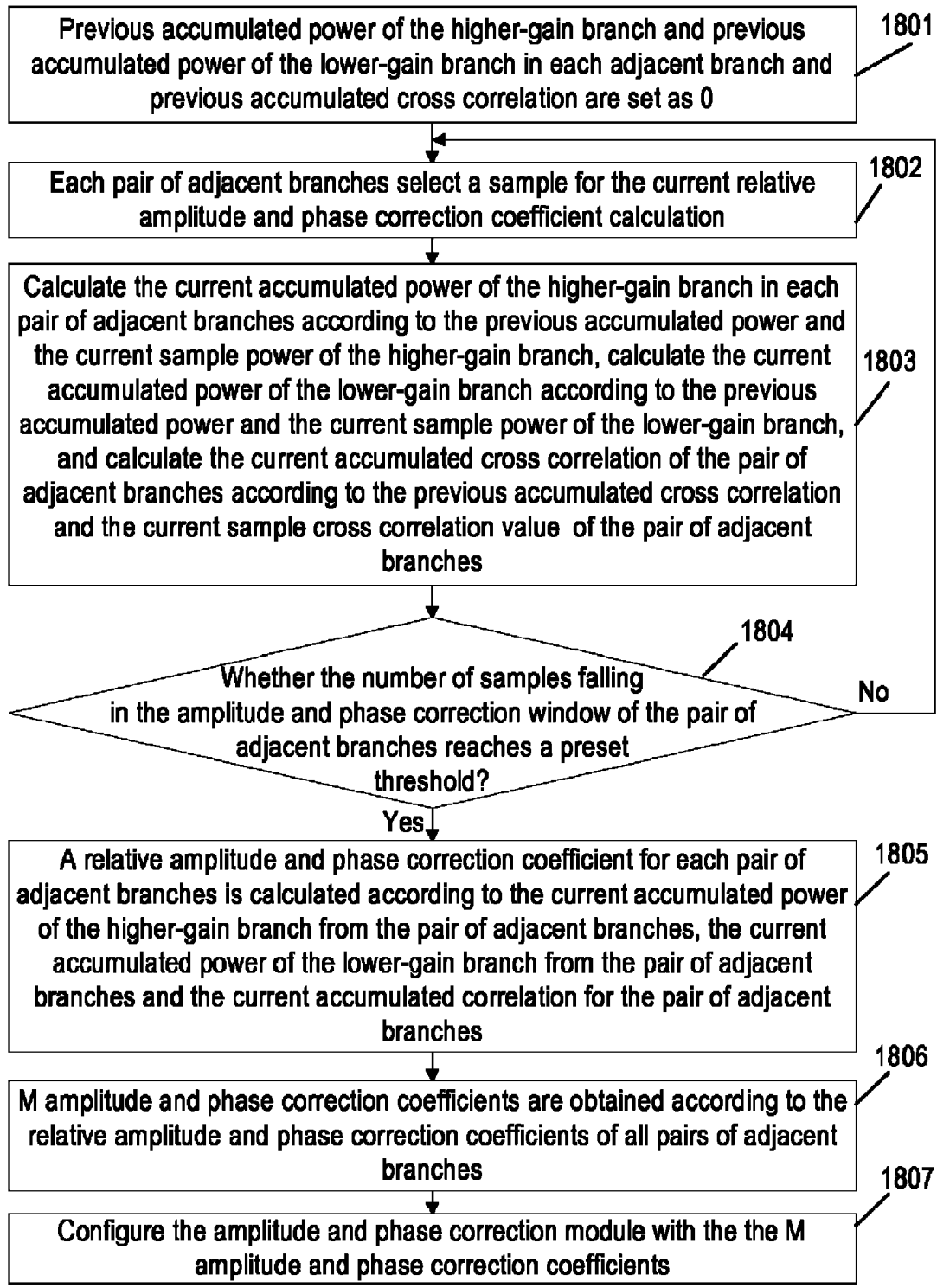
FIG. 18 is a flow chart illustrating a method for calculating an initial value of an amplitude and phase correction coefficient, according to a first embodiment of the present invention.

FIG. 18 is a flow chart illustrating a method for calculating an initial value of an amplitude and phase correction coefficient, according to the embodiment of the invention. As shown in FIG. 18, the method for calculating the initial value of the amplitude and phase correction coefficient includes the following.

Step 1801: The previous accumulated power of the higher-gain branch and the previous accumulated power of the lower-gain branch in each adjacent branch and the previous accumulated cross correlation are set as 0.

In practice, initial values of relative amplitude and phase correction coefficients may be firstly configured for the various pairs of adjacent branches, and subsequently, all amplitude and phase correction coefficients are calculated using the initial values of the relative amplitude and phase correction coefficients and configured for the amplitude and phase correction module. At this point, the initialization of the amplitude and phase correction coefficients starts. In other words, calculation of the real initial values of the amplitude and phase correction coefficients starts.

Step 1802: Each pair of adjacent branches select a sample for the current relative amplitude and phase correction coefficient calculation from samples obtained through the processing by a multi-branch correction preprocess module, with the use of their amplitude and phase correction window.

Step 1803: Each pair of adjacent branches calculate the current accumulated power of the higher-gain branch in the pair of adjacent branches using the previous accumulated power and the current sample power within the amplitude and phase correction window of the higher-gain branch of the pair of adjacent branches, calculate the current accumulated power of the lower-gain branch in the pair of adjacent branches using the previous accumulated power and the current sample power of the lower-gain branch of the pair of adjacent branches, and calculate the current accumulated cross correlation for the pair of adjacent branches using the previous accumulated cross correlation and the current sample cross correlation value of the pair of adjacent branches.

In the embodiment, Steps 1802 and 1803 are similar to Steps 1 and 2 in the method for calculating the amplitude and phase correction coefficient in the invention, and description thereof is omitted.

Step 1804: Each pair of adjacent branches determine whether the number of samples falling in the amplitude and phase correction window of the pair of adjacent branches reaches a preset threshold; if the preset threshold is reached, Step 1805 is carried out; otherwise, Step 1802 is carried out.

In the method for calculating the amplitude and phase correction coefficient, $l_{AP,k}$ is used to record the number of samples falling in the amplitude and phase correction window of the kth pair of adjacent branches. It is necessary that enough samples fall in the amplitude and phase correction window with respect to each pair of adjacent branches, to ensure high precision of the amplitude and phase correction coefficients of all the branches. The threshold of the number of samples falling in the amplitude and phase correction window needs to be set in advance for each pair of adjacent branches dependent upon applications. In other words, a preset threshold of the number of samples falling in the amplitude and phase correction window is determined necessarily. If the preset threshold of number of samples falling in the amplitude and phase correction window is reached for all pairs of adjacent branch, Step 1805 is carried out; otherwise, all the pairs of adjacent branches keep on waiting for more suitable samples.

It is noted that initial values of $l_{AP,k}$, $P_{k,H}(l_{AP,k})$, $P_{k,L}(l_{AP,k})$ and $R_{AP,k}(l_{AP,k})$ for each pair of adjacent branches are 0 after the receiver is powered on or reset. However, every time a sample falls in an amplitude and phase correction window of a pair of adjacent branches, $l_{AP,k}$ is increased by 1, and $P_{k,H}(l_{AP,k})$, $P_{k,L}(l_{AP,k})$ and $R_{AP,k}(l_{AP,k})$ are updated correspondingly, then the updated values will be used as the previous accumulated values for the calculation of new values of $P_{k,H}(l_{AP,k})$, $P_{k,L}(l_{AP,k})$ and $R_{AP,k}(l_{AP,k})$ when a sample falls in the amplitude and phase correction window again. Thus, the values of $P_{k,H}(l_{AP,k})$, $P_{k,L}(l_{AP,k})$ and $R_{AP,k}(l_{AP,k})$ are not 0 after the calculation of initial values of the amplitude and phase correction coefficients.

The values of $P_{k,H}(l_{AP,k})$, $P_{k,L}(l_{AP,k})$, $R_{AP,k}(l_{AP,k})$ and $l_{AP,k}$ are not reset to 0 until next reset. The values obtained from initialization are used as initial values after the operation period starts.

Step 1805: A relative amplitude and phase correction coefficient for each pair of adjacent branches is calculated using the current accumulated power of the higher-gain branch from the pair of adjacent branches, the current accumulated power of the lower-gain branch from the pair of adjacent branches and the current accumulated correlation value of the pair of adjacent branches.

In practice, the calculation of the relative amplitude and phase correction coefficient according to signal samples may be performed for all pairs of adjacent branches randomly. In other words, the input signal is not targeted for a specific pair of adjacent branches, instead, the input signal varies within dynamic ranges of the various branches, and Steps 1802 to 1805 are performed for all pairs of adjacent branches randomly, until the calculation of the relative amplitude and phase correction coefficients for all pairs of adjacent branches is completed. Alternatively, the relative amplitude and phase correction coefficient may be calculated for each pair of adjacent branches in a time division manner. In other words, the power of the input signal is deliberately adjusted to be within an amplitude and phase correction window of a pair of adjacent branches, so that the relative amplitude and phase correction coefficient of the pair of adjacent branches is calculated; subsequently, the power of the input signal is deliberately adjusted to be within an amplitude and phase correction window of another pair of adjacent branches, and the relative amplitude and phase correction coefficient of the other pair of adjacent branches is calculated, and so on, until the relative amplitude and phase correction coefficients of all pairs of adjacent branches are calculated.

Step 1806: M amplitude and phase correction coefficients are obtained, according to the relative amplitude and phase correction coefficients of all pairs of adjacent branches.

In the embodiment, Steps 1805 and 1806 are similar to Steps 3 and 4 in the method for calculating the amplitude and phase correction coefficient, and description thereof is omitted.

Step 1807: The M amplitude and phase correction coefficients are configured for the amplitude and phase correction module.

After the initial values of the amplitude and phase correction coefficients are configured for the amplitude and phase correction module, the receiver can begin to receive wireless signals from an antenna, and the amplitude and phase correction coefficients are maintained unchanged. The configuration of all the amplitude and phase correction coefficients for the amplitude and phase correction module is to write all the amplitude and phase correction coefficients into registers corresponding to the M amplitude and phase correction coefficients in the amplitude and phase correction module.

It is assumed that the offline configuration mode is deployed in the embodiment. If the receiver is provided with a correction signal injecting module, the input signal for the offline configuration of the initial values of the amplitude and phase correction coefficients may be the correction signal from the correction signal injecting module, or a signal suitable for correction which is injected directly from an antenna input. If the receiver is provided with no correction signal injecting module, the input signal for the offline configuration of the initial values of the amplitude and phase correction coefficients may be a signal suitable for correction which is injected directly from an antenna input.

In practice, if the initial values of the amplitude and phase correction coefficients are configured in the online configuration mode, the input signal for the configuration of the initial values of the amplitude and phase correction coefficients may be the input signal of the receiver from the antenna or the correction signal from the correction signal injecting module.

In the embodiment, after configured with the initial values of the amplitude and phase correction coefficients, the receiver starts receiving wireless signals, converts the wireless signals into a bit stream and outputs the bit steam.

Figure 19:
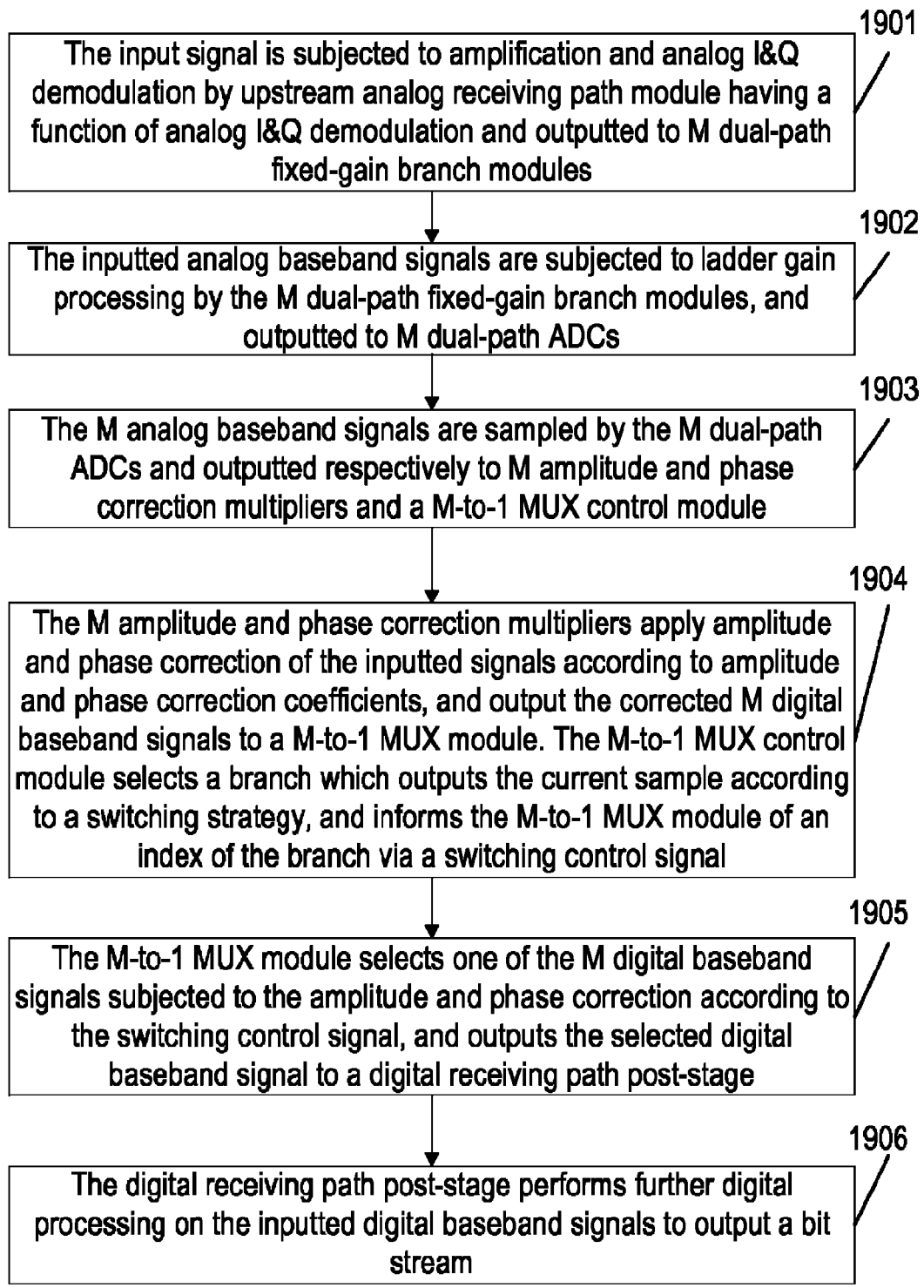
FIG. 19 is a flow chart illustrating a first embodiment of the method in the present invention.

FIG. 19 is a flow chart illustrating the wireless signal receiving method, according to the present embodiment. As shown in FIG. 19, the wireless signal receiving method, according to the embodiment includes the following.

Step 1901: An upstream analog receiving path module having a function of analog I&Q demodulation performs processing such as amplification and analog I&Q demodulation on the input signal of the receiver to obtain analog baseband signals, which are outputted to the M dual-path fixed-gain branch modules.

In practice, the upstream analog receiving path module having the function of analog I&Q demodulation may further perform processing such as frequency mixing and filtering on the input signal of the receiver.

Step 1902: The inputted analog baseband signals are subjected to ladder gain processing by the M dual-path fixed-gain branch modules, and outputted to M dual-path ADCs.

Step 1903: The M dual-path ADCs sample the M analog baseband signals to obtain M digital baseband signals, which are outputted, respectively, to M amplitude and phase correction multipliers and a M-to-1 MUX control module.

Step 1904: The M amplitude and phase correction multipliers apply amplitude and phase correction to the inputted M digital baseband signals according to amplitude and phase correction coefficients stored in advance, and output the corrected M digital baseband signals to an M-to-1 MUX module. The M-to-1 MUX control module selects a branch which outputs the current sample according to a switching strategy, and informs the M-to-1 MUX module of an index of the selected branch via a switching control signal.

At Step 1904, the M amplitude and phase correction coefficients inputted to the M amplitude and phase correction multipliers are the M initial values of amplitude and phase correction coefficients configured in advance for the amplitude and phase correction module 1104 with the offline configuration mode in the embodiment.

Step 1905: The M-to-1 MUX module selects one of the M digital baseband signals subjected to the amplitude and phase correction according to the switching control signal, and outputs the selected digital baseband signal to a digital receiving path post-stage.

Step 1906: The digital receiving path post-stage performs further digital processing on the inputted digital baseband signals to output a bit stream.

A Second Embodiment of the Method

FIG. 12 is a schematic diagram showing the essential structure of the receiver according to the present embodiment. As shown in FIG. 12, amplitude and phase correction coefficients are configured in the online configuration mode in the embodiment. In other words, initial values of amplitude and phase correction coefficients for M branches are calculated by an amplitude and phase correction coefficient calculating module after the receiver is powered on or reset, and configured for an amplitude and phase correction module 1205. Subsequently, new amplitude and phase correction coefficients for the M branches are continuously calculated by the amplitude and phase correction coefficient calculating module and re-configured for the amplitude and phase correction module 1205.

The calculation and configuration procedure of the initial values of the amplitude and phase correction coefficients of the M branches is similar to that in the first embodiment of the method, and description thereof is omitted.

Figure 20:
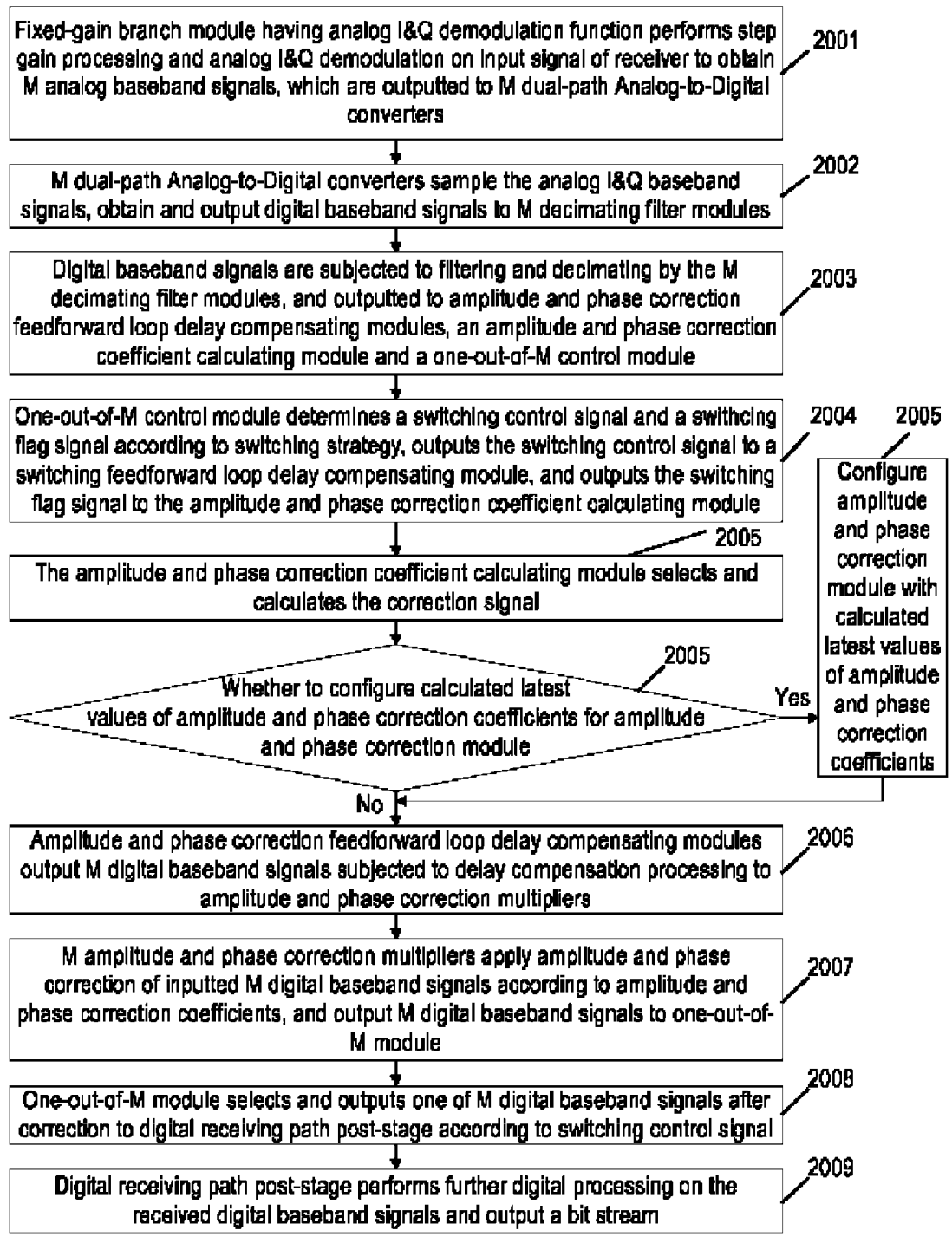
FIG. 20 is a flow chart illustrating a second embodiment of the method in the present invention.

FIG. 20 is a flow chart illustrating the wireless signal receiving method in the embodiment. As shown in FIG. 20, after initial values of the amplitude and phase correction coefficients are configured for the amplitude and phase correction module, the wireless signal receiving method, according to the embodiment includes the following.

Step 2001: A fixed-gain branch module having a function of analog I&Q demodulation performs ladder gain processing and analog I&Q demodulation on the input signal of the receiver to obtain M analog baseband signals, which are outputted to M dual-path ADCs.

Step 2002: The M dual-path ADCs sample the analog baseband signals, obtain and output digital baseband signals to M decimating filter modules.

Step 2003: The inputted digital baseband signals are subjected to low-pass filtering and decimation by the M decimating filter modules, and outputted to amplitude and phase correction feedforward loop delay compensating modules, an amplitude and phase correction coefficient calculating module and a M-to-1 MUX control module.

Step 2004: The M-to-1 MUX control module determines an index of the branch which outputs the current sample according to a switching strategy, generates a switching control signal carrying the index of the branch and a switching flag signal indicating whether to switch, outputs the switching control signal to a switching feedforward loop delay compensating module, and outputs the switching flag signal to the amplitude and phase correction coefficient calculating module.

At Step 2004, the M-to-1 MUX control module can figure out whether the index of the branch which is to output the current sample is the same as the index of the branch which outputs the previous sample according to the switching strategy, and thereby generates the switching control signal and the switching flag signal accordingly. If the M-to-1 MUX control module finds out that the branch which is to output the nth sample is the same as the branch which outputs the (n−1)th sample, the branch index in the switching control signal remains the same as the index of the branch which outputs the (n−1)th sample, and the switching flag signal indicates no switching for the current sample; otherwise, the branch index in the switching control signal is a new branch index, and the switching flag signal indicates to switch for the current sample. As to the format of the switching flag signal, the switching flag signal may be designed as a one-bit signal, and if the switching is required for the current sample, the switching flag signal is 1; otherwise, the switching flag signal is 0.

Step 2005: The amplitude and phase correction coefficient calculating module selects and calculates the correction signal, and determines whether to configure the latest calculated values of the amplitude and phase correction coefficients for the amplitude and phase correction module, according to the switching flag signal and the latest values of the amplitude and phase correction coefficients. If to configure the latest calculated values of the amplitude and phase correction coefficients for the amplitude and phase correction module, the latest values of the amplitude and phase correction coefficients are configured for the amplitude and phase correction module; otherwise, the latest values of the amplitude and phase correction coefficients are not configured for the amplitude and phase correction module.

The calculation of new amplitude and phase correction coefficients by the amplitude and phase correction coefficient calculating module is similar to the calculation of the initial values of the amplitude and phase correction coefficients.

Once a suitable sample falls in the amplitude and phase correction window, a new amplitude and phase correction coefficient is calculated directly using the existing previous accumulated power and the current sample power. The method for calculating the latest value of the amplitude and phase correction coefficient includes the following.

Y1. The amplitude and phase correction coefficient calculating module determines a sample for the current relative amplitude and phase correction calculation from the inputted samples with the use of the amplitude and phase correction window of each pair of adjacent branches.

Y2. Each pair of adjacent branches calculate the current accumulated power of the higher-gain branch in the pair of adjacent branches using the previous accumulated power and the current sample power within the amplitude and phase correction window of the higher-gain branch of the pair of adjacent branches, calculate the current accumulated power of the lower-gain branch in the pair of adjacent branches using the previous accumulated power and the current sample power of the lower-gain branch of the pair of adjacent branches, and calculate the current accumulated cross correlation for the pair of adjacent branches using the previous accumulated cross correlation and the current sample cross correlation value of the pair of adjacent branches.

Y3. A relative amplitude and phase correction coefficient for each pair of adjacent branches is calculated using the current accumulated power of the higher-gain branch from the pair of adjacent branches, the current accumulated power of the lower-gain branch from the pair of adjacent branches and the current accumulated correlation value of the pair of adjacent branches.

Y4. The amplitude and phase correction coefficient calculating module obtains the latest values of all the amplitude and phase correction coefficients, using the amplitude and phase correction coefficients of all pairs of adjacent branches.

In practice, the input signals of the amplitude and phase correction coefficient calculating module may be M digital baseband signals before amplitude and phase correction, or M digital baseband signals after the amplitude and phase correction. The calculation of the amplitude and phase correction coefficient is similar for both the signals before the amplitude and phase correction and the signals after the amplitude and phase correction. In the case of samples of the signals after the amplitude and phase correction, the effect of the original amplitude and phase correction coefficients needs to be removed in the process of the calculation. In other words, the M digital baseband signals after the amplitude and phase correction are converted to the M digital baseband signals before the amplitude and phase correction after being divided by the original amplitude and phase correction coefficients, and subsequently the amplitude and phase correction coefficients are calculated. Alternatively, the amplitude and phase correction coefficients are calculated directly from signals of the M digital baseband signals after the amplitude and phase correction, and the calculated amplitude and phase correction coefficients are multiplied by the original amplitude and phase correction coefficients to obtain the latest values of the real amplitude and phase correction coefficients.

At this step, the amplitude and phase correction coefficient calculating module determines whether to configure the latest values of the amplitude and phase correction coefficients for the amplitude and phase correction module as follows: after receiving the switching flag signal for the current sample from the M-to-1 MUX control module, the amplitude and phase correction coefficient calculating module determines whether the switching is required for the current sample according to the switching flag signal. If the switching is required, the amplitude and phase correction coefficient calculating module further determines whether new amplitude and phase correction coefficients are already calculated after the previous configuration of amplitude and phase correction coefficients for the amplitude and phase correction module, and if the new amplitude and phase correction coefficients are already calculated, the latest values of the amplitude and phase correction coefficients are configured for the amplitude and phase correction module; on the contrary, if the switching flag signal indicates that no switching is required for the current sample, or no new amplitude and phase correction coefficient is already calculated by the amplitude and phase correction coefficient calculating module after the previous configuration of amplitude and phase correction coefficients for the amplitude and phase correction module, the amplitude and phase correction coefficients need no update.

In practice, if the switching flag signal sent by the M-to-1 MUX control module to the amplitude and phase correction coefficient calculating module indicates to switch for the current sample, the amplitude and phase correction coefficient calculating module may configure the amplitude and phase correction module with amplitude and phase correction coefficients, which may be the latest values of the amplitude and phase correction coefficients calculated after the previous configuration of the amplitude and phase correction coefficients for the amplitude and phase correction module or the previous amplitude and phase correction coefficients, regardless of whether new amplitude and phase correction coefficients are calculated. If the configured amplitude and phase correction coefficients are the previous amplitude and phase correction coefficients, the amplitude and phase correction module is configured with the original values of the amplitude and phase correction coefficients again, without changing the value of the amplitude and phase correction coefficients of the amplitude and phase correction module.

Additionally, in practice, the M-to-1 MUX control module may configure new values of the amplitude and phase correction coefficients for the M amplitude and phase correction multipliers periodically, regardless of whether to switch from a branch to another branch.

Step 2006: The amplitude and phase correction feedforward loop delay compensating modules output the M digital baseband signals of which the delays have been compensated to the amplitude and phase correction multipliers.

In the embodiment, the amplitude and phase correction feedforward loop delay compensating modules, the amplitude and phase correction coefficient calculating module and the M-to-1 MUX control module process the inputted digital baseband signals simultaneously. For example, when the nth sample is currently under processing, the amplitude and phase correction coefficient calculating module calculate amplitude and phase correction coefficients according to the nth sample, and the M-to-1 MUX control module determines a branch to output the current sample according to the switching strategy, and generates the switching control signal and the switching flag signal. If switching from one branch to another branch is required, the M-to-1 MUX control module sends to the amplitude and phase correction coefficient calculating module the switching flag signal indicating that the switching is required for the current sample, and if new amplitude and phase correction coefficients have been calculated by the amplitude and phase correction coefficient calculating module after the previous configuration of the amplitude and phase correction coefficients for the amplitude and phase correction module, the amplitude and phase correction coefficient calculating module configures immediately the new calculated amplitude and phase correction coefficients for the amplitude and phase correction module. Meanwhile, after passing through the amplitude and phase correction feedforward loop delay compensating modules, the nth sample is outputted to the M amplitude and phase correction multipliers while the amplitude and phase correction coefficients are configured, subjected to amplitude and phase correction by the M amplitude and phase correction multipliers according to the newly configured amplitude and phase correction coefficients, and outputted to the M-to-1 MUX module.

Step 2007: The M amplitude and phase correction multipliers apply the amplitude and phase correction to the inputted M digital baseband signals according to the latest values of the amplitude and phase correction coefficients, and output the M digital baseband signals to the M-to-1 MUX module.

In the embodiment, the M amplitude and phase correction multipliers correct the M digital baseband signals, according to the amplitude and phase correction coefficients newly configured for the amplitude and phase correction module. In other words, the correction is performed by the M amplitude and phase correction multipliers according to the initial values of the amplitude and phase correction coefficients before the first online calculation of new values of the amplitude and phase correction coefficients. After the first online calculation of new values of the amplitude and phase correction coefficients, the correction is performed according to the new calculated values of the amplitude and phase correction coefficients configured for the amplitude and phase correction module.

Step 2008: According to the switching control signal after the delay compensation by the amplitude and phase correction feedforward loop delay compensating modules, the M-to-1 MUX module selects and outputs one of the M digital baseband signals after the correction to the digital receiving path post-stage.

Step 2009: The digital receiving path post-stage performs further digital processing on the received digital baseband signals and output a bit stream.

A Third Embodiment of the Method

FIG. 13 is a schematic diagram showing the essential structure of the receiver according to the present embodiment. As shown in FIG. 13, the receiver according to the present embodiment is similar to that deployed in the second embodiment of the method. However, delay errors exist between the branches in the embodiment and a delay correcting module is provided to apply delay corrections to the signals. In addition, the processing of analog signals includes no analog I&Q demodulation in the embodiment; instead, digital I&Q demodulation components are provided to carry out the I&Q demodulation processing. The delay corrections in the embodiment are implemented with M low-pass filter modules in the digital I&Q demodulation component. In other words, the digital I&Q demodulation components, a delay correction coefficient calculating module and a filter coefficient calculating module form the delay correcting module. In practice, extra M low-pass filter modules instead of the M low-pass filter modules in the digital I&Q demodulation component may be added to implement the delay correction.

In the embodiment, to initialize the receiver, the switch in the correction signal injecting module is switched to a contact 2, amplitude and phase correction coefficients and a filter coefficient are calculated using the correction signal generated by the correction signal injecting module, and the calculated initial values of the amplitude and phase correction coefficients and the calculated initial value of the filter coefficient are configured, respectively, for the amplitude and phase correction module and the M low-pass filters. After that, the switch in the correction signal injecting module is switched to a contact 1, and the input signal from the antenna may be received.

The calculation of the initial values of the amplitude and phase correction coefficients in the embodiment is similar to that of the initial values of the amplitude and phase correction coefficients in the first embodiment of the method, and description thereof is omitted.

Figure 21:
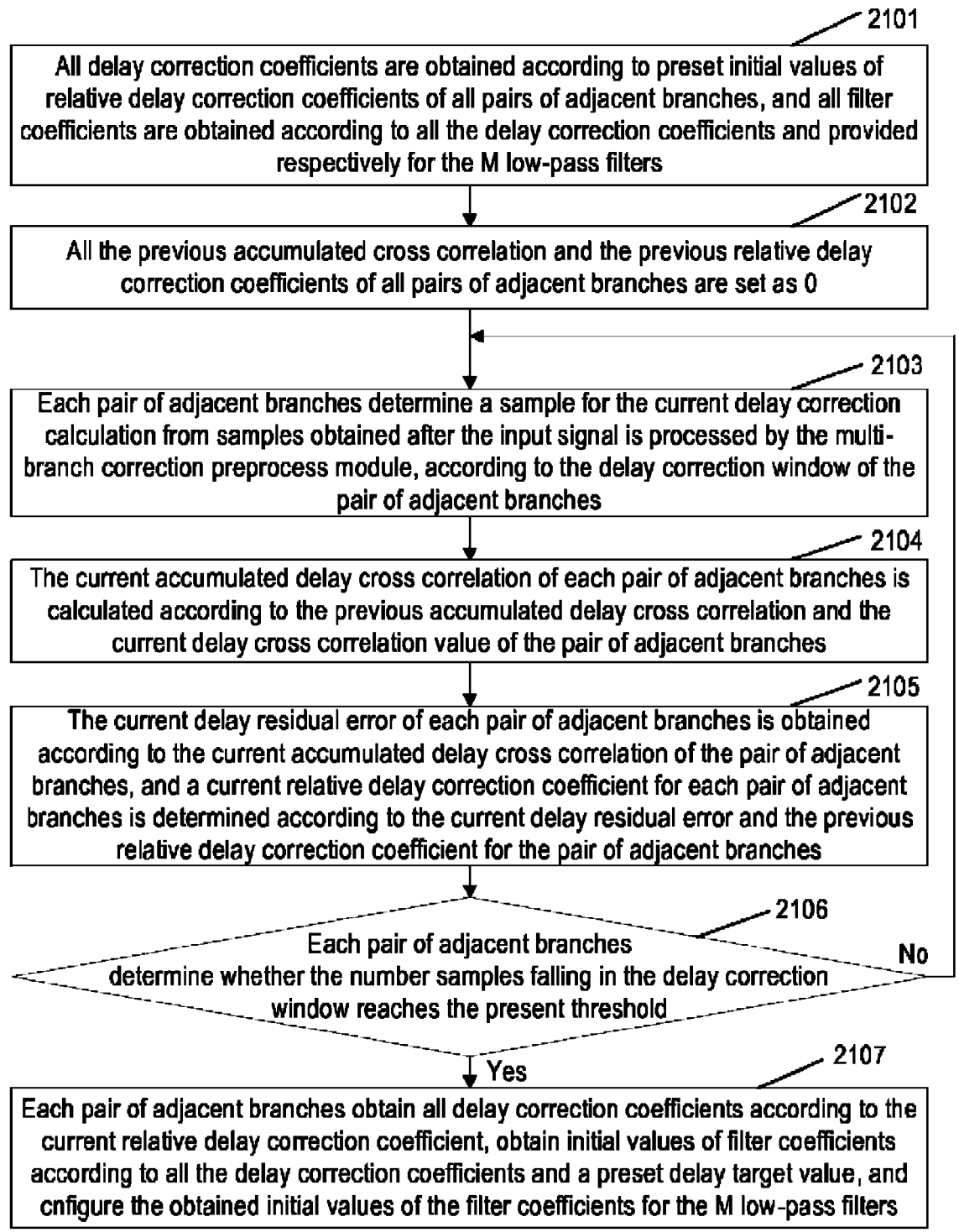
FIG. 21 is a flow chart illustrating a method for calculating an initial value of a filter coefficient, according to a third embodiment of the present invention.

FIG. 21 is a flow chart illustrating a method for calculating the initial value of the filter coefficient according to the embodiment. As shown in FIG. 21, the method for calculating the initial value of the filter coefficient includes the following.

Step 2101: All delay correction coefficients are obtained according to preset initial values of relative delay correction coefficients of all pairs of adjacent branches, then all filter coefficients are obtained according to all the delay correction coefficients and configured respectively for the M low-pass filters.

Step 2102: All the previous accumulated cross correlations and the previous relative delay correction coefficients for all pairs of adjacent branches are set as 0.

Step 2103: Each pair of adjacent branches determine a sample for the current delay correction calculation from samples obtained after the input signal is processed by the multi-branch correction preprocess module, according to the delay correction window of the pair of adjacent branches.

Step 2104: The current accumulated delay cross correlation for each pair of adjacent branches is calculated using the previous accumulated delay cross correlation and the current delay cross correlation value of the pair of adjacent branches.

Step 2105: The current delay residual error of each pair of adjacent branches is obtained according to the current accumulated delay cross correlation for the pair of adjacent branches, and a current relative delay correction coefficient for each pair of adjacent branches is determined according to the current delay residual error and the previous relative delay correction coefficient for the pair of adjacent branches.

Step 2106: Each pair of adjacent branches determine whether the number of samples falling in the delay correction window reach the preset threshold, and if the number reaches the preset threshold, Step 2107 is carried out; otherwise, Step 2103 is carried out.

Similar to the calculation of initial values of the amplitude and phase correction coefficients, only if enough samples fall in the delay correction window, the calculated delay correction coefficient is reliable. Therefore, the threshold of the number of samples falling in the delay correction window is set in advance dependent upon an application.

In the embodiment, all pairs of adjacent branches may calculate relative delay correction coefficients using the inputted signals simultaneously. In other words, Steps 2102 and 2106 are carried out simultaneously, but Step 2107 is carried out only after sufficient samples fall in the correction window for each pair of adjacent branches and relative delay correction coefficients for all pairs of adjacent branches are calculated. Alternatively, in practice, it is possible to control the power of a correction signal to be within the delay correction window of a pair of adjacent branches and calculate the relative delay correction coefficient for the pair of adjacent branches, and then the relative delay correction coefficients for the other pairs of adjacent branches are calculated in turn likewise, and then Step 2107 is carried out.

Step 2107: Each pair of adjacent branches obtain all delay correction coefficients according to the current relative delay correction coefficient, obtain initial values of filter coefficients according to all the delay correction coefficients and a preset delay target value, and configure the obtained initial values of the filter coefficients for the M low-pass filters.

Similar to the calculation of the initial values of the amplitude and phase correction coefficients, the input signal used for calculating the initial values of the filter coefficients in practice may be the input signal used for providing the initial values of the filter coefficients in the offline configuration mode or the input signal of the receiver. The application scenario of the calculation of the initial values of the filter coefficients is the same as that of the calculation of the initial values of the amplitude and phase correction coefficients in the first embodiment of the method, and description thereof is omitted.

In the embodiment, after configured with the initial values of the amplitude and phase correction coefficients and those of the filter coefficients, the receiver starts to operate, receives the wireless signal and outputs the bit stream.

Figure 22:
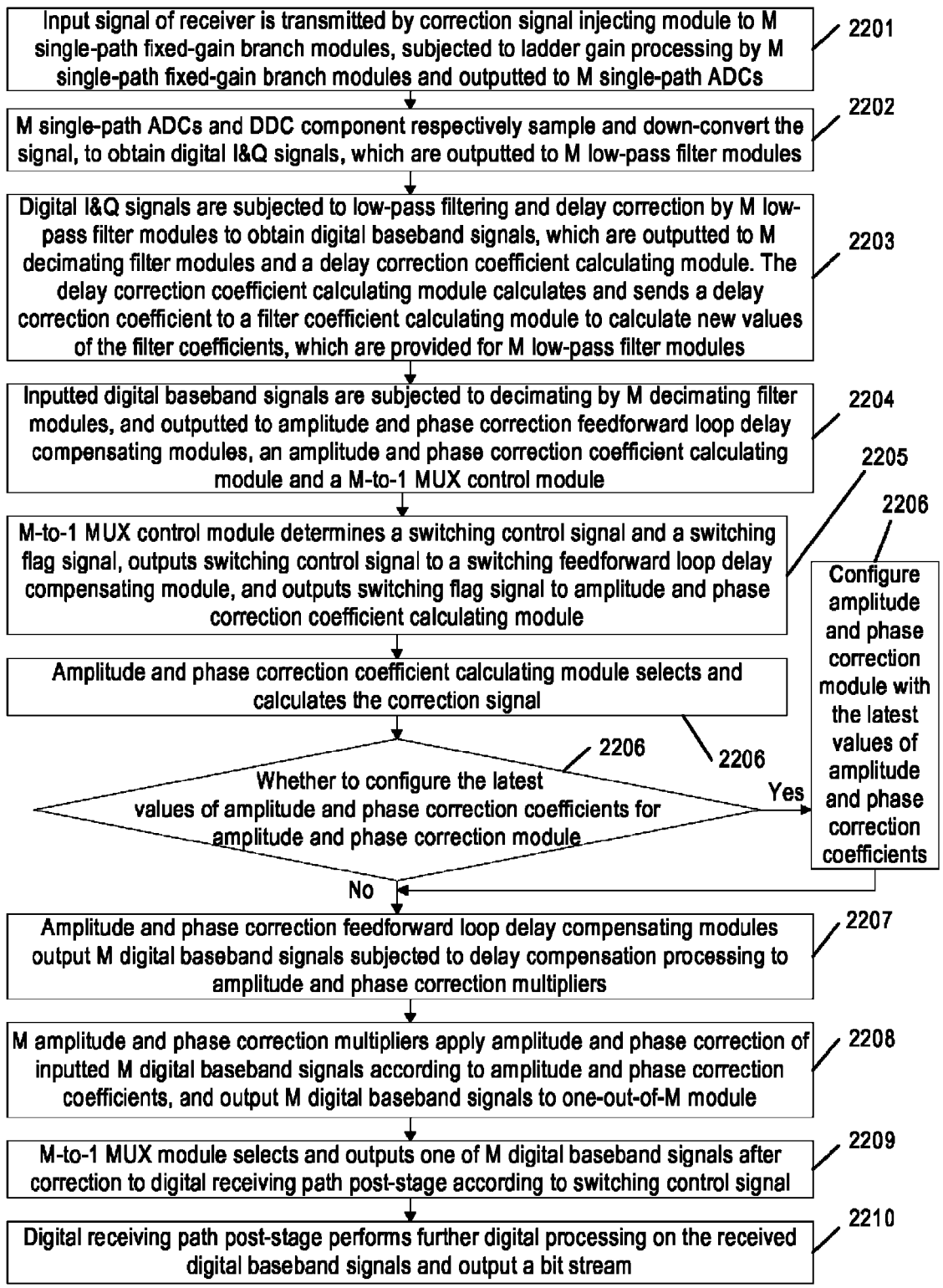
FIG. 22 is a flow chart illustrating a third embodiment of the method in the present invention.

FIG. 22 is a flow chart illustrating the wireless signal receiving method according to the present embodiment. As shown in FIG. 22, the wireless signal receiving method includes the following.

Step 2201: The Input signal of the receiver is transferred through the correction signal injecting module to M single-path fixed-gain branch modules, subjected to ladder gain processing by the M single-path fixed-gain branch modules and then outputted to M single-path ADCs.

Step 2202: The M single-path ADCs and a DDC component respectively sample and down-convert the signal, to obtain digital I&Q signals, which are outputted to M low-pass filter modules.

Step 2203: The digital I&Q signals are low-pass filtered by the M low-pass filter modules, and subjected to delay correction according to the filter coefficients to obtain digital baseband signals, which are outputted to M decimating modules and a delay correction coefficient calculating module. The delay correction coefficient calculating module calculates delay correction coefficients using the inputted digital baseband signals, and sends the new delay correction coefficients to the filter coefficient calculating module to calculate new values of the filter coefficients, which are configured for the M low-pass filter modules.

Step 2203 is to calculate the new values of the filter coefficients with a method similar to that for calculating the initial values of the filter coefficients. However, the new values of the filter coefficients are calculated directly based on the initial values of the filter coefficients, and it is not necessary to determine whether the number of sample falling in the delay correction window reaches the preset value. The method for calculating the new value of the filter coefficient includes the following.

H1. The delay correction coefficient calculating module selects the current sample used for the current delay correction calculation from the inputted samples, according to the delay correction window of each pair of adjacent branches.

H2. The delay correction coefficient calculating module calculates the current accumulated delay cross correlation for each pair of adjacent branches using the previous accumulated delay cross correlation and the current delay cross correlation value of the pair of adjacent branches.

H3. The delay correction coefficient calculating module obtains the current delay residual error of each pair of adjacent branches using an accumulated cross correlation of the pair of adjacent branches, and calculates the current relative delay correction coefficient for the pair of adjacent branches using the current delay residual error and the previous relative delay correction coefficient.

H4. The delay correction coefficient calculating module obtains all delay correction coefficients using the current relative delay correction coefficients of all pairs of adjacent branches, and sends all the obtained delay correction coefficients to the filter coefficient calculating module.

H5. The filter coefficient calculating module obtains the latest values of the filter coefficients using all the delay correction coefficients and the preset delay target value.

Steps 2204 to 2210 are similar to Steps 2003 to 2009 in the second embodiment of the method, except that no filtering but decimating processing is carried out at Step 2205, and description thereof is omitted.

In practice, if the receiver has a structure as shown in FIG. 16, the wireless signal receiving method is similar to that in the present embodiment, except that the input signal of the receiver is subjected to I&Q demodulation at the analog signal processing stage before digital sampling, to obtain digital baseband signals, which are subsequently subjected to the delay correction by the specific delay correction modules, and the description thereof is omitted for the similarity.

In addition, if the receiver includes a direct current and I&Q error correction module, the digital baseband signals outputted from the multi-branch correction preprocess module are subjected to direct current and I&Q error correction processing to remove errors caused by the circuit, i.e. to remove direct current errors in the I and Q signals that are caused by the imperfect characteristics of the circuit and amplitude and phase errors between the I and Q branches. After that, processing, such as delay correction and amplitude and phase correction, is carried out.

Through the solutions in the embodiments of the invention, the input signal of the receiver, which is an analog band-pass signal, is converted into a digital baseband signal at each branch, and the digital baseband signal is subjected to amplitude and phase correction, so that the digital baseband signals of all the branches are aligned to each other in terms of amplitude and phase. If a delay error which is not negligible exists in a branch of the receiver, the digital baseband signals need to be subjected to the delay correction before the amplitude and phase correction, so that signal samples from all the branches are aligned to each other temporally. Subsequently, the amplitude and phase correction is carried out to align the digital baseband signals in terms of amplitude and phase. As a result, the switching can be performed on a sample by sample basis in the invention, so that demodulation performance is improved and the non-simultaneous dynamic range is increased.

In practice, how the digital baseband signals are obtained through the multi-branch correction preprocess, whether an offline configuration mode or an online configuration mode is used to configure initial values of amplitude and phase correction coefficients, whether to decimate the signal, whether to compensate a delay during the operation of the receiver, whether to correct the delays of the signals before the amplitude and phase correction, whether an offline configuration mode or an online configuration mode is used to configure the delay correction coefficients, whether the direct current and I&Q error corrections are performed, whether to apply delay corrections and amplitude and phase corrections of the signals by using the correction signal, and so on, all depend on the diverse applications, and various combinations of the above may be obtained, but the wireless signal receiving methods obtained from the combinations are not described in detail herein.

Therefore, the foregoing description is merely illustrative of the preferred embodiments of the invention, and is not intended to limit the scope of the invention. All modifications, alternations, and variations made within the principle of the invention are indented to be within the scope of the invention.

What is claimed is:

1. A receiver, comprising a multi-branch correction preprocess module, a digital receiving path post-stage, and a multi-branch correcting and switching module; wherein the multi-branch correcting and switching module comprises:

an amplitude and phase correction module, configured to obtain corrected M digital baseband signals according to the M digital baseband signals outputted from the multi-branch correction preprocess module and M amplitude and phase correction coefficients in the amplitude and phase correction module, and output the corrected M digital baseband signals to an M-to-1 Multiplexer module;

an M-to-1 Multiplexer control module, configured to generate a switching control signal carrying an index of a branch according to the M digital baseband signals outputted from the multi-branch correction preprocess module and a switching strategy, and output the switching control signal to the M-to-1 Multiplexer module; and the M-to-1 Multiplexer module, configured to select one of the corrected M digital baseband signals outputted from the amplitude and phase correction module according to the switching control signal outputted from the M-to-1 Multiplexer control module, and output the selected digital baseband signal to a digital receiving path post-stage;

wherein M is a positive integer greater than 1.

2. The receiver of claim 1, wherein the multi-branch correcting and switching module further comprises:

an amplitude and phase correction coefficient calculating module, configured to calculate the M amplitude and phase correction coefficients using the M digital baseband signals outputted from the multi-branch correction preprocess module or corrected M digital baseband signals output from the amplitude and phase correction module, and output the M calculated amplitude and phase correction coefficients to the amplitude and phase correction module according to a switching flag signal outputted from the M-to-1 Multiplexer control module;

wherein the M-to-1 Multiplexer control module is further adapted to generate the switching flag signal according to the M digital baseband signals outputted from the multi-branch correction preprocess module and the switching strategy, and output the switching flag signal to the amplitude and phase correction coefficient calculating module.

3. The receiver of claim 2, wherein the multi-branch correcting and switching module further comprises:

M amplitude and phase correction feedforward loop delay compensating modules, configured to apply delay compensation on the M digital baseband signals outputted from the multi-branch correction preprocess module, and output the compensated digital baseband signals to the amplitude and phase correction module; or apply delay compensation on the amplitude and phase correction coefficients outputted from the amplitude and phase correction coefficient calculating module, and output the compensated amplitude and phase correction coefficients to the amplitude and phase correction module.

4. The receiver of claim 1, wherein the multi-branch correcting and switching module further comprises:

a switching feedforward loop delay compensating module, configured to apply delay compensation on the switching control signal outputted from the M-to-1 Multiplexer control module, and output the compensated switching control signal to the M-to-1 Multiplexer module; or apply delay compensation on the M digital baseband signals outputted from the multi-branch correction preprocess module, and output the compensated M digital baseband signals to the amplitude and phase correction module; or apply delay compensation on the M digital baseband signals subjected to the amplitude and phase correction and outputted from the amplitude and phase correction module, and output the compensated M digital baseband signals to the M-to-1 Multiplexer module.

5. The receiver of claim 1, further comprising:
a decimating filter, configured to subject the M digital baseband signals outputted from the multi-branch correction preprocess module to low-pass filtering and decimating processing, and output the M digital baseband signals to the amplitude and phase correction module.

6. The receiver of claim 1, wherein the multi-branch correction preprocess module at least comprises:
an upstream analog receiving path module having a function of analog inphase and quadrature (I&Q) demodulation, configured to perform upstream analog receiving processing including the analog I&Q demodulation on an input signal of the receiver to obtain analog baseband signals, and output the obtained analog baseband signals to M dual-path fixed-gain branch modules;
the M dual-path fixed-gain branch modules, configured to perform ladder gain processing on the M analog baseband signals outputted from the upstream analog receiving path module having the function of analog I&Q demodulation, and output the processed M analog baseband signals to M dual-path analog to digital converters; and
the M dual-path analog to digital converters, configured to sample and convert the analog baseband signals outputted from the M dual-path fixed-gain branch modules into the M digital baseband signals, and output the M digital baseband signals to the multi-branch correcting and switching module.

7. The receiver of claim 1, wherein the multi-branch correction preprocess module at least comprises:
M fixed-gain branch modules each having a function of analog inphase and quadrature (I&Q) demodulation, configured to perform ladder gain processing and the analog I&Q demodulation on an input signal of the receiver to obtain analog baseband signals, and output the analog baseband signals to M dual-path analog to digital converters; and
the M dual-path analog to digital converters, configured to sample and convert the analog baseband signals outputted from the M fixed-gain branch modules each having the function of analog I&Q demodulation into the M digital baseband signals, and output the M digital baseband signals to the multi-branch correcting and switching module.

8. The receiver of claim 7, wherein the multi-branch correction preprocess module further comprises:
an upstream analog receiving path module without the function of analog I&Q demodulation, configured to perform upstream analog receiving processing including no analog I&Q demodulation on the input signal of the receiver, and output the processed signal to the M fixed-gain branch modules each having the function of analog I&Q demodulation.

9. A wireless signal receiving method, comprising:
A. performing multi-branch correction preprocess on an input signal of a receiver, to obtain M digital baseband signals before amplitude and phase correction;
B. performing the amplitude and phase correction on the M digital baseband signals according to obtained M amplitude and phase correction coefficients, and selecting one of the M digital baseband signals subjected to the amplitude and phase correction according to a generation of switching control signal;
C. performing digital processing on the selected digital baseband signal to obtain a bit stream;
wherein the generation of the switching control signal comprises: determining one of the M digital baseband signals before the amplitude and phase correction as a selected branch according to a switching strategy, and generating the switching control signal carrying a branch index corresponding to the selected branch;
wherein M is a positive integer greater than 1.

10. The method of claim 9, wherein the M amplitude and phase correction coefficients are obtained with an amplitude and phase correction coefficient calculating method.

11. The method of claim 10, wherein
before performing amplitude and phase correction on the M digital baseband signals, step B further comprises: performing amplitude and phase correction feedforward loop delay compensation on the M digital baseband signals before the amplitude and phase correction; or
after obtaining the M amplitude and phase correction coefficients, step B further comprises: performing amplitude and phase correction feedforward loop delay compensation on the obtained M amplitude and phase correction coefficients.

12. The method of claim 10, wherein
after generating the switching control signal at step B, the generation of the switching control signal further comprises: performing switching feedforward loop delay compensation on the generated switching control signal;
before performing the amplitude and phase correction on the M digital baseband signals before the amplitude and phase correction, step B further comprises: performing switching feedforward loop delay compensation on the M digital baseband signals before the amplitude and phase correction; or
between performing the amplitude and phase correction on the M digital baseband signals before the amplitude and phase correction and selecting one of the M digital baseband signals subjected to the amplitude and phase correction, step B further comprises: performing switching feedforward loop delay compensation on the M digital baseband signals subjected to the amplitude and phase correction.

13. The method of claim 10, wherein the calculation of the amplitude and phase correction coefficients comprises:
X1. for each pair of adjacent branches, selecting a sample for the current calculation of the relative amplitude and phase correction coefficients from signal samples obtained after the input signal is subjected to multi-branch correction preprocess or the amplitude and phase correction, with the use of an amplitude and phase correction window of the pair of adjacent branches;
X2. for each pair of the adjacent branches, calculating a current accumulated power of a higher-gain branch in the pair of the adjacent branches according to a previous accumulated power of the higher-gain branch and the current sample power of the higher-gain branch within the amplitude and phase correction window of the pair of the adjacent branches, calculating a current accumulated power of the lower-gain branch in the pair of the adjacent branches according to a previous accumulated power of the lower-gain branch and the current sample power of the lower-gain branch, and calculating a current accumulated cross correlation for the pair of the adjacent branches according to a previous accumulated cross correlation and the current sample cross correlation value for the pair of the adjacent branches;

X3. for each pair of the adjacent branches, calculating a relative amplitude and phase correction coefficient for the pair of the adjacent branches according to the current accumulated power of the higher-gain branch in the pair of the adjacent branches, the current accumulated power of the lower-gain branch in the pair of the adjacent branches and the current accumulated cross correlation for the pair of the adjacent branches; and X4. obtaining the M amplitude and phase correction coefficients according to the relative amplitude and phase correction coefficients of all the pairs of the adjacent branches.

14. The method of claim 13, wherein the amplitude and phase correction coefficients are assigned with initial values of the amplitude and phase correction coefficients;

the input signal at step X1 is the input signal for offline configuration of the initial values of the amplitude and phase correction coefficients or the input signal of the receiver; and between steps X2 and X3, the method further comprises:

for each pair of the adjacent branches, determining whether the number of samples falling in the amplitude and phase correction window of the pair of the adjacent branches reaches a preset threshold, and if the preset threshold is reached, carrying out step X3; otherwise, carrying out step X1.

15. The method of claim 13, wherein the amplitude and phase correction coefficients are configured with the latest values of the amplitude and phase correction coefficients;

the input signal at step X1 is the correction signal or an input signal of the receiver; and after generating the switching control signal at step B, the method further comprises: generating a switching flag signal according to the selected branch, and assigning the current M amplitude and phase correction coefficients with the latest calculated values of the M amplitude and phase correction coefficients according to the switching flag signal.

16. The method of claim 9, wherein the switching strategy comprises:

S1. determining a branch having the largest gain but not saturated as a candidate selected branch from the M digital baseband signals before the amplitude and phase correction; and S2. determining whether the previous sample outputted from an M-to-1 Multiplexer module is outputted from a lower-gain branch adjacent to the candidate selected branch, and whether the power of the current sample in the candidate selected branch is no lower than a hysteresis low threshold; if the previous sample is outputted from the lower-gain branch adjacent to the candidate selected branch and the power of the current sample in the candidate selected branch is no lower than the hysteresis low threshold, selecting the lower-gain branch adjacent to the candidate selected branch as the selected branch which outputs the current sample; otherwise, selecting the candidate selected branch as the branch which outputs the current sample.

17. The method of claim 9, wherein between steps A and B, the method further comprises:

performing low-pass filtering and decimation on the M digital baseband signals obtained after the multi-branch correction preprocess and before the amplitude and phase correction.

18. The method of claim 9, wherein step A comprises:

AX1. performing upstream analog receiving processing including analog inphase and quadrature (I&Q) demodulation on the input signal of the receiver to obtain an M analog baseband signals; and AX2. performing ladder gain processing on the M analog baseband signals and sampling the M analog baseband signals, to obtain the M digital baseband signals before the amplitude and phase correction.

19. The method of claim 9, wherein step A comprises:

AY1. performing ladder gain processing and analog inphase and quadrature (I&Q) demodulation on the input signal of the receiver to obtain M analog baseband signals; and AY2. sampling the M analog baseband signals to obtain the M digital baseband signals before the amplitude and phase correction.

20. The method of claim 19, wherein before performing ladder gain processing on the input signal of the receiver, step AY1 further comprises:

performing upstream analog receiving processing not including analog I&Q demodulation on the input signal of the receiver to obtain processed analog band-pass signals.

\* \* \* \* \*